(12) United States Patent
Lindsey et al.

(10) Patent No.: US 7,633,007 B2
(45) Date of Patent: Dec. 15, 2009

(54) SELF-ASSEMBLED PHOTOSYNTHESIS-INSPIRED LIGHT HARVESTING MATERIAL AND SOLAR CELLS CONTAINING THE SAME

(75) Inventors: Jonathan S. Lindsey, Raleigh, NC (US); Muthiah Chinnasamy, Raleigh, NC (US); Dazhong Fan, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 11/782,288

(22) Filed: Jul. 24, 2007

(65) Prior Publication Data

US 2008/0029155 A1     Feb. 7, 2008

Related U.S. Application Data

(60) Provisional application No. 60/835,215, filed on Aug. 3, 2006.

(51) Int. Cl.
  *H01L 31/00*  (2006.01)
(52) U.S. Cl. .................................. 136/263; 540/145
(58) Field of Classification Search ................. 136/263; 540/145

See application file for complete search history.

(56) References Cited

U.S. PATENT DOCUMENTS 5,173,504 A    12/1992   Dougherty

| | | | |
|---|---|---|---|
| 6,407,330 B1 * | 6/2002 | Lindsey et al. | 136/263 |
| 6,559,374 B2 | 5/2003 | Lindsey et al. | |
| 6,777,402 B2 | 8/2004 | Nifantiev et al. | |
| 6,867,310 B1 | 3/2005 | Buchwald et al. | |

FOREIGN PATENT DOCUMENTS

WO      WO 2007-064842 A3      6/2007

OTHER PUBLICATIONS

Tamiaki, H., et al. "Aggregation of Synthetic Zinc Chlorins with Several Esterified Alkyl Chains as Models of Bacteriochlorophyll-c Homologs", Tetrahedron, vol. 52, No. 38, no month given, 1996, p. 12421-12432.*

Kim H-J. De novo synthesis of bacteriochlorins, North Carolina State University—Thesis, Ph.D. [online]. Mar. 2005. lib.ncsu.edu/theses/available/etd-03242005-180313/unrestricted/etd. 149 pp.

(Continued)

*Primary Examiner*—Nam X Nguyen
*Assistant Examiner*—J. Christopher Ball
(74) *Attorney, Agent, or Firm*—Myers Bigel Sibley & Sajovec, P.A.

(57) ABSTRACT

A solar cell is described that comprises: (a) a semiconductor charge separation material; (b) at least one electrode connected to the charge separation material; and (c) a light-harvesting film on the charge separation material, the light-harvesting film comprising non-covalently coupled, self-assembled units of porphyrinic macrocycles. The porphyrinic macrocycles preferably comprise: (i) an intramolecularly coordinated metal; (ii) a first coordinating substituent; and (iii) a second coordinating substituent opposite the first coordinating substituent. The porphyrinic macrocycles can be assembled by repeating intermolecular coordination complexes of the metal, the first coordinating substituent and the second coordinating substituent.

21 Claims, 2 Drawing Sheets

OTHER PUBLICATIONS

Smith KM et al. Aggregation of the bacteriochlorophylls *c, d* and *e*. Models for the antenna chlorophylls of green and brown photosynthetic bacteria. J. Am. Chem. Soc. (1983), vol. 105, pp. 1387-1389.

Chiefari J et al. Models for the pigment organization in the chlorosomes of photosynthetic bacteria: diastereoselective control of in-vitro bacteriochlorophyll $c_s$ aggregation. J. Phys. Chem. (1995) vol. 99, pp. 1357-1365.

Balaban TS et al. Green self-assembling porphyrins and chlorins as mimics of the natural bacteriochlorophylls *c, d* and *e*. Eur. J. Org. Chem. (2004), pp. 3919-2930.

Thamyongkit P et al. Alkylthio unit as an α-pyrrole protecting group for use in dipyrromethane synthesis. J. Org. Chem. (2006), vol. 71, pp. 903-910.

Ptaszek M et al. Synthesis of 1-formyldipyrromethanes. J. Org. Chem. (2006), vol. 71, pp. 4328-4331.

Miyatake T et al. Self-assembly of synthetic zinc chlorins in aqueous microheterogeneous media: structural and functional models for chlorosomes. Photosynthesis: Mechanisms and Effects, vol. 1, G. Garab (ed.) Proceedings of the XIth International Congress on Photosynthesis, Budapest, Hungary, Aug. 17-22, 1998, pp. 133-136. Kluwer Academic Publishers, Dordrecht, the Netherlands.

Balaban TS et al. Chlorins programmed for self-assembly. Top. Curr. Chem. (2005), vol. 258, pp. 1-38.

Miyatake T and Tamiaki H. Self-aggregates of bacteriochlorophylls-*c, d* and *e* in a light-harvesting antenna system of green photosynthetic bacteria: effect of stereochemistry at the chiral 3-(1-hydroxyethyl) group on the supramolecular arrangement of chlorophyllous pigments. Journal of Photochemistry and Photobiology C: Photochemistry Reviews 6 (2005), pp. 89-107.

International Search Report and Written Opinion for PCT/US07/16538, mailed Aug. 13, 2008.

* cited by examiner

SELF-ASSEMBLED PHOTOSYNTHESIS-INSPIRED LIGHT HARVESTING MATERIAL AND SOLAR CELLS CONTAINING THE SAME

RELATED APPLICATIONS

This application claims the benefit of provisional application Ser. No. 60/835,215, filed Aug. 3, 2006, the disclosure of which is hereby incorporated herein by reference in its entirety. This application is also related to Jonathan S. Lindsey, Joydev K. Laha, and Chinnasamy Muthiah, Synthesis of Chlorins and Phorbines with Enhanced Red Spectral Features, U.S. Provisional Patent Application No. 60/740,924; Filed Nov. 30, 2005.

GOVERNMENT FUNDING

This invention was made with Government support under Grant No. GM36238 from the National Institutes of Health and Grant No. DE-FG02-96ER14632 from the Department of Energy. The US Government has certain rights to this invention.

FIELD OF THE INVENTION

The present invention concerns solar cells, methods of making solar cells, and compounds and compositions useful for the manufacture of solar cells.

BACKGROUND OF THE INVENTION

The structures of chlorophyll and derivatives, and their numbering system, are shown in Scheme 1.

Scheme 1. Chlorin numbering system

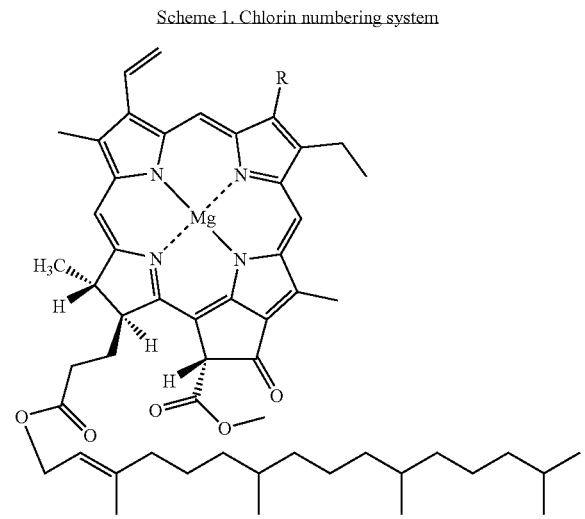

Chlorophyll a (R = CH$_3$)
Chlorophyll b (R = CHO)

-continued

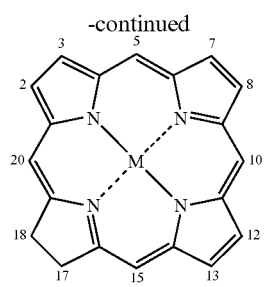

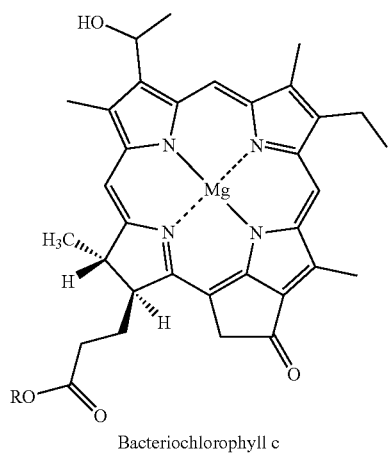

Bacteriochlorophyll c

Over 20 years ago, the issue arose as to the nature of the self-assembled structures of the bacteriochlorophyll c molecules that comprise the intact chlorosomes of green photosynthetic bacteria (note that bacteriochlorophyll c is a chlorin, not a bacteriochlorin; this unfortunate misnomer is often a source of considerable confusion). Bacteriochlorophyll c differs from chlorophyll primarily in (1) having a 3-(α-hydroxyethyl) group in place of the 3-vinyl group, and (2) lacking the β-ketoester attached to the isocyclic ring. Smith, Kehres, and Fajer[25] put forth a model for molecular interactions underlying aggregation. This model, which was developed in part by examination of the "aggregation" of bacteriochlorophyll c and analogues in hydrophobic organic solvents, with some embellishment is now widely accepted (Scheme 2).

In the early 1990s, Holzwarth began to address the question of what key substituents at the perimeter of the bacteriochlorophyll molecule are essential to cause the self-assembly process.[26] Holzwarth in particular examined the R and S configurations of the α-hydroxyethyl unit at the 3-position (i.e., the 3$^1$-hydroxyethyl group) of the bacteriochlorophyll c molecule, because the natural system apparently uses a 2:1 ratio of the R:S mixture.

Scheme 2. Molecular interactions in the assembly of bacteriochlorophyll c (many substituents omitted for clarity)

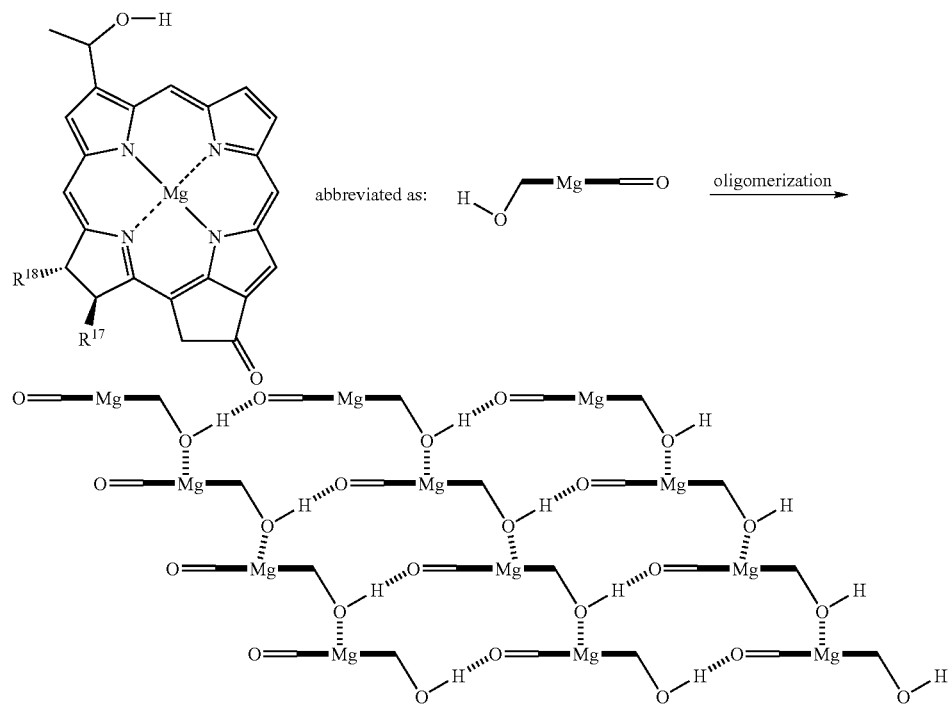

Two of Holzwarth's group members, Hitoshi Tamiaki and T. Silviu Balaban, continued this line of research. Tamiaki, employing synthetic derivatives of naturally occurring chlorophylls and bacteriochlorophylls, has examined the requirements for substituents at a variety of positions about the perimeter of the macrocycle on the self-assembly process. Balaban, on the other hand, has employed synthetic porphyrins (and just recently, some chlorins[27]) with different patterns of substituents and examined their self-assembly properties. Their findings can be summarized as follows.

Balaban's work, while unconstrained by starting with the naturally occurring tetrapyrrole macrocycles, has focused almost exclusively with the more synthetically accessible porphyrins rather than hydroporphyrins. He first showed that the α-hydroxyalkyl unit and keto groups must be directly attached to the porphyrin macrocycle, not at the p-positions of meso-aryl rings.[28] He then showed that self-assembly occurs with zinc porphyrins bearing 10,20-bis(3,5-di-tert-butylphenyl) substituents and: (1) $3^1$-hydroxyethyl and 13-acetyl, 15-formyl, or 17-acetyl groups; (2) 5-(hydroxymethyl) and 15-formyl or 13-acetyl groups; or (3) $3^1$-hydroxyethyl and 17-acetyl groups. A representative structure is shown in Scheme 3. This work suggested that a linear arrangement of interacting groups is not essential, although the self-assembly is more extensive in the compounds having such a linear configuration.[27] In all of Balaban's studies, the key observable for the occurrence of self-assembly was the alteration of the optical absorption spectrum. No studies of energy transfer were performed. Moreover, it is noteworthy that the porphyrin aggregates did not exhibit the type of relatively sharp, banded spectra characteristic of the naturally occurring hydroporphyrins.

Scheme 3. Balaban's self-assembling porphyrin.

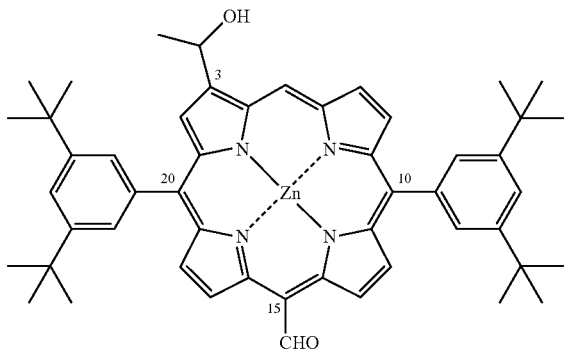

Within the confines of the scientific box presented by using naturally occurring (bacterio)chlorophylls as synthetic starting materials, Tamiaki has extensively explored the effects of substituents. (In general, the naturally occurring tetrapyrroles bear a full or nearly full complement of substituents about the perimeter of the macrocycle, thus not giving free rein to studies where substituents are employed to tune oxidation potentials and photophysical properties, as has been done with synthetic porphyrins.) For the most part, this work was done using chlorins rather than bacteriochlorins. This work spans ~50 papers over a 13-year period. I have attempted to summarize Tamiaki's pertinent findings in Table 1. The structures employed generally are zinc chelates of naturally occurring chlorins (see the generic structure in Scheme 4), not bacteriochlorins. The assemblies occur upon placing the compounds in a hydrophobic organic solvent.

The studies show that the self-assembly process requires an α-hydroxyalkyl group, a keto group, and a metal with an apical binding site, preferably in an essentially linear arrangement, and preferably without a $13^2$-carbomethoxy group. All of the studies relied on absorption spectroscopy (UV-Vis, IR) to assess the existence of oligomerization. A few studies of energy transfer in self-assembled systems derived from the zinc chelate of the chlorin bacteriochlorophyll c were performed, suggesting that the assembled structures support energy transfer.[41]

TABLE 1

Summary of Tamiaki studies of substituted chlorins.
Scheme 4. Core chlorin in Tamiaki's studies (left) and bacteriochlorophyll d (right)

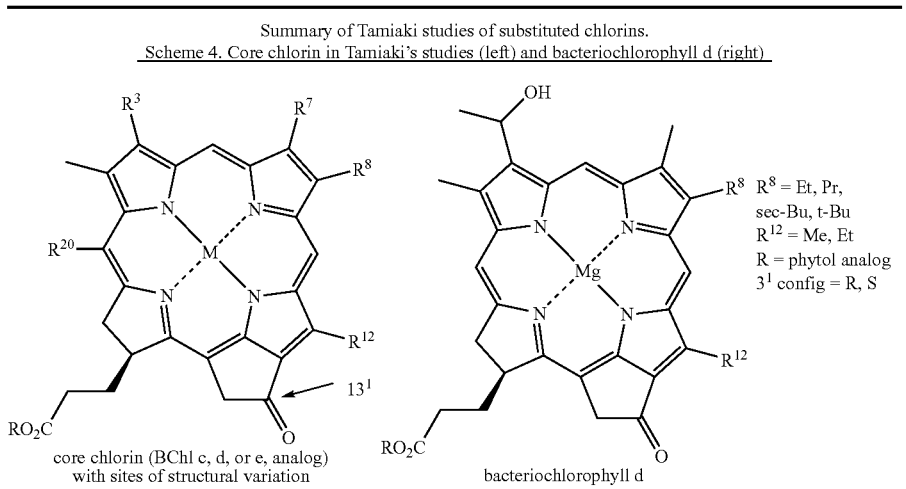

| Ref | Analogue | Variable | Result |
|---|---|---|---|
| 29 | Zn Me Bph d | $3^1$R versus $3^1$S epimer | $Q_y$ maximum of the assemblies differ by 12 nm |
| 30 | Zn Me Bph d | Replacement of the $3^1$-hydroxy group with an amino group (NMe$_2$, NHMe, NH$_2$) | Amines cause presence primarily of dimers (perhaps antiparallel) rather than the typical extended aggregates (parallel) |
| 31 | Zn Me Bph c | length of the esterified alkyl group at the $17^3$-position | No effect for 1-4 isoprene units |
| 32 | Zn Me Bph a | Zinc tetrapyrrolic macrocycles (porphyrin, chlorin, or bateriochlorin | aggregates occur regardless of the porphyrinic hydrogenation state |
| 33 | Zn Me Bph d | A $13^1$-hydroxy (rather than keto) group | Also results in self-assembly |
| 34 | Zn Me Bph d | Size of alkyl group at 3-position where the hydroxy group is at the $3^1$-position | The relative stability of aggregates decreases along the series of 3-substituents: hydroxymethyl > R-α-hydroxyethyl~α-hydroxy-α-methylethyl > S-α-hydroxyethyl |
| 35 | Me Bph d | electron-withdrawing groups (cyano, carbomethoxy) at the $3^2$-vinyl group | redshifts of the $Q_y$ band of up to 30-nm |
| 36 | chlorophyll α | $13^2$-epimer (where the 13-carbomethoxy group is on the same plane as the 17 alkyl substituent) | affords a different aggregate than the naturally occurring chlorophyll α |
| 37 | Zn Me Bph d | Inverse keto and hydroxyl groups (i.e., 3-acetyl, $13^1$-hydroxy) | spectral shifts comparable to that of the normal substituent pattern (13-keto, $3^1$-hydroxyethyl) |
| 38 | Zn Me Bph d | $13^1$ R versus S epimer | $13^1$ R epimer gives a face-to-face closed dimer; $13^1$ S epimer gives head-to-tail open oligomers |
| 39 | Zn Me Bph d | $7^1$-hydroxymethyl group (3-vinyl) versus normal $3^1$-hydroxymethyl group (7-methyl) | $7^1$-hydroxymethyl group (3-vinyl) causes self-assembly but the spectral shift (1320 cm$^{31\ 1}$) was less than normal (1860-1940 cm$^{-1}$) |
| 40 | Zn Me Bph d | 8-hydroxymethyl group versus normal ($3^1$-hydroxymethyl and 8-alkyl groups) | causes self-assembly as long as the 3-substituent is ethyl rather than acetyl, the aggregates are less structured than the normal compound |
| 41 | Zn Me Bph c | substituents at the 20-position (H, F, Cl, Br, Me, CF$_3$) | All are tolerated in the self-assembly process |
| 42 | Zn Me Bph d | bulky ROCH$_2$— groups at the 7-position; R = Me, acetyl, or pivaloyl | All are tolerated in the self-assembly process |
| 43 | Zn Me Bph d | presence of a methoxycarbonyl group at the $13^2$-position (resembling chlorophyll α) | does not preclude self-assembly, but the extent extent of assembly is diminished |
| 44 | Zn Me Bph d | Elongation of the 3-hydroxyalkyl chain along the series 1-hydroxyethyl, 2-hydroxyethyl, 3-hydroxypropyl, and 3-hydroxyprop-1-enyl | does not cause cessation of self-assembly but the extent of redshift of the $Q_y$ band is diminished with increasing length |
| 45 | Zn Me Bph d | divalent metals Mg, Zn, Cd, and Co | assembly |
| 45 | Zn Me Bph d | divalent metals Ni, Cu, Pd, or Ag | no assembly |
| 45 | Zn Me Bph d | trivalent metals Fe(III) and Mn(III) | partial assembly |
| 46 | Zn Me Bph d | Ethenylation of the 8-position (vinyl, styryl) | noticeable redshifts of the B band but not the $Q_y$ band; no effects on assembly process |

TABLE 1-continued

Summary of Tamiaki studies of substituted chlorins.
Scheme 4. Core chlorin in Tamiaki's studies (left) and bacteriochlorophyll d (right)

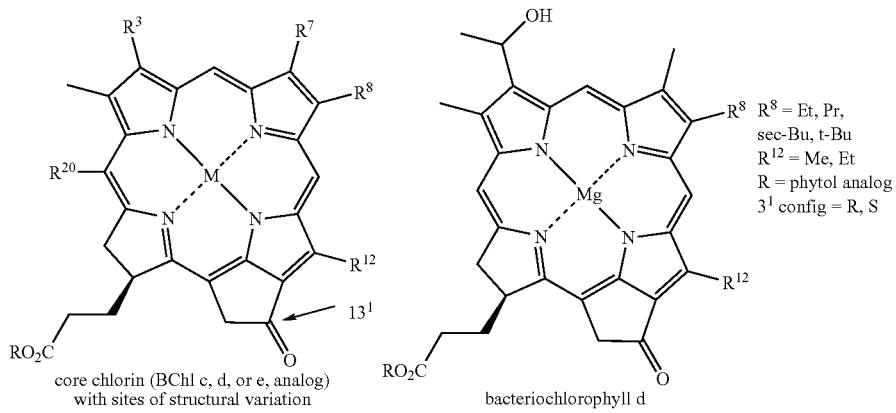

| Ref | Analogue | Variable | Result |
|---|---|---|---|
| 47 | Zn Me Bph d | Move the formyl group from the 7-position (as in Bchl e) to the 8-position | causes a 22-nm redshift of the $Q_y$ band. The self-assembled aggregate of the latter also gave a more extensive redshift than the former |

(In Table 1, Zn Me Bph d refers to the bacteriochlorophll d analogue where zinc is the central metal and R is methyl (on the ester). The variable refers to subsequent modifications from this core motif)

The study of light-harvesting in the assemblies described in this work has been quite limited despite the elegant work of Tamiaki and others. The limitations are as follows:

(1) self-assembly has hardly been studied with bacteriochlorins (i.e., tetrahydroporphyrins) regardless of their source and certainly not with stable bacteriochlorins.
(2) assessment of oligomerization has largely been inferred on the basis of absorption spectroscopy.
(3) of the assemblies that have been prepared, few energy-transfer studies have been performed, even fewer of which included time-resolved measurements. To our knowledge, no estimates of exciton diffusion lengths, for example, have been made in any such materials.

SUMMARY OF THE INVENTION

The strong absorption by bacteriochlorins in the near-IR region makes these pigments especially attractive for fundamental studies in light-harvesting and solar energy conversion. Such studies place a premium on the simplicity of synthesis and stability of the bacteriochlorin product. We have developed a synthetic method that meets both of these objectives (vide infra). The $3^1$-hydroxyethyl and $13^1$-keto groups in the naturally occurring chlorins bacteriochlorophylls c, d, and e cause self-assembly to occur wherein the $Q_y$ transition dipole moments are predominantly collinear (e.g., Scheme 5). The absence of such substituents in the most simple synthetic bacteriochlorins may result in other patterns (alternating, helical, herringbone, random parallel/perpendicular, etc.) of the transition dipole moments in the crystal.

Scheme 5. Alignment upon self-assembly of bacteriochlorophylls c, d, or e.

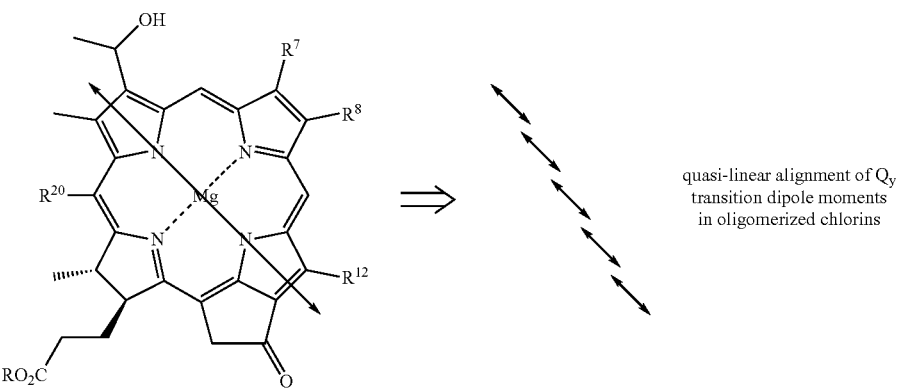

quasi-linear alignment of $Q_y$ transition dipole moments in oligomerized chlorins Accordingly, a first aspect of the invention is a solar cell, comprising:

(a) a semiconductor charge separation material; (b) at least one electrode connected to the charge separation material; and (c) a light-harvesting film on the charge separation material, the light-harvesting film comprising non-covalently coupled, self-assembled units of porphyrinic macrocycles;

wherein the porphyrinic macrocycles comprise: (i) an intramolecularly coordinated metal; (ii) a first coordinating substituent; and (iii) a second coordinating substituent opposite the first coordinating substituent. The porphyrinic macrocycles are assembled by repeating intermolecular coordination complexes of the metal, the first coordinating substituent and the second coordinating substituent.

The first coordinating substituent may be any suitable substituent, such as hydroxy, mercapto, or amino (which amino may be substituted or unsubstituted). The second coordinating substituent may likewise by any suitable substituent, such as oxo (=O) or thio (=S). In general, by "positioned opposite" is meant that the first and second coordinating substituents are substantially aligned along the transition dipole moment of the porphyrinic macrocycle, e.g. as shown in Scheme 5 above. Thus, for example, the first coordinating substituent may be substituted on the porphyrinic macrocycle at the 2, 3, or 5 position, preferably the 5 position, and the second coordinating substituent may be substituted on the porphyrinic macrocycle at the $13^1$ position.

The foregoing and other objects and aspects of the invention are explained in greater detail in the specification set forth below.

DETAILED DESCRIPTION OF THE PREFERRED EMBODIMENTS

Figure 1:
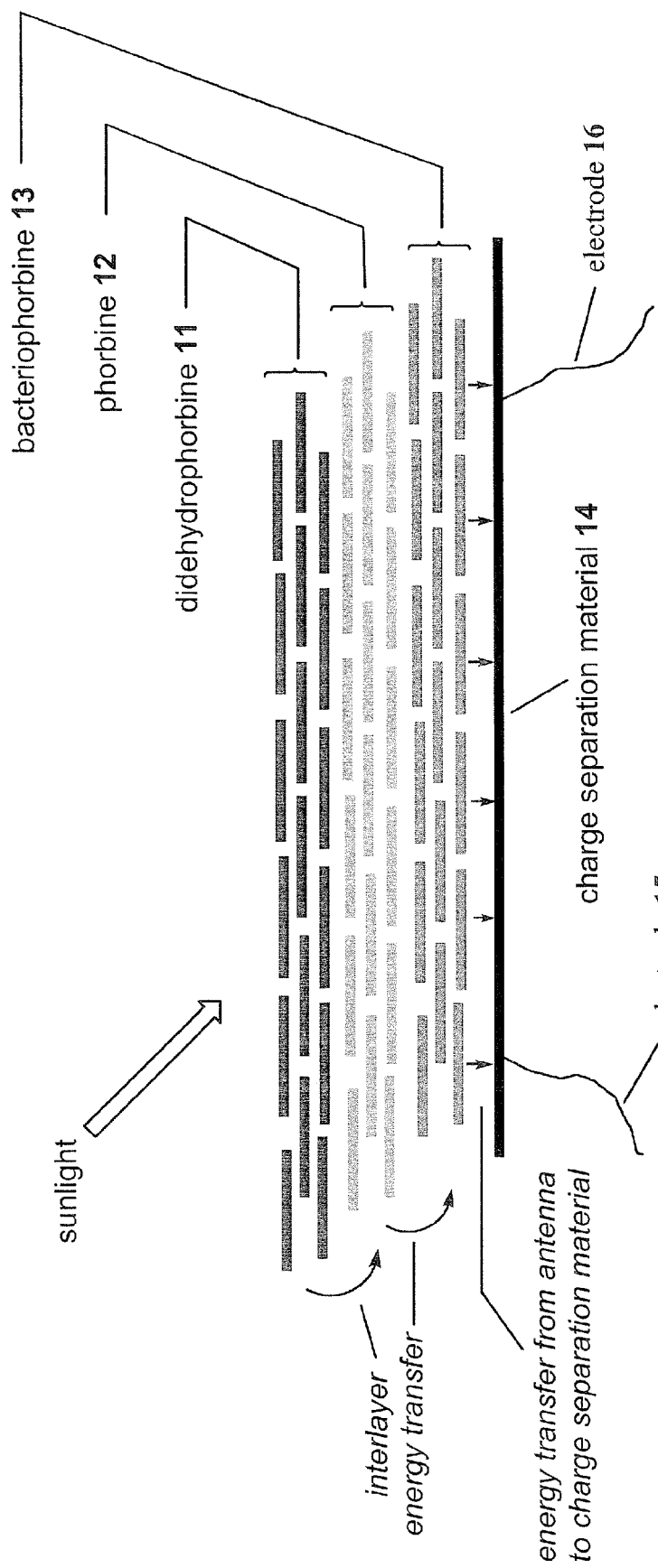
FIG. 1 schematically illustrates one embodiment of a light harvesting film and charge separation material in the present invention, with three different layers and showing energy transfer between the layers and to the charge separation material.

The disclosures of all United States patent references cited herein are to be incorporated by reference herein as if fully set forth.

"Halo" as used herein refers to any suitable halogen, including —F, —Cl, —Br, and —I.

"Mercapto" as used herein refers to an —SH group.

"Azido" as used herein refers to an —$N_3$ group.

"Cyano" as used herein refers to a —CN group.

"Hydroxyl" as used herein refers to an —OH group.

"Nitro" as used herein refers to an —$NO_2$ group.

"Alkyl" as used herein alone or as part of another group, refers to a straight or branched chain hydrocarbon containing from 1 or 2 to 10, 20 or 50 carbon atoms (e.g., C1 to C4 alkyl; C4 to C10 alkyl; C11 to C50 alkyl). Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, n-decyl, and the like. "Loweralkyl" as used herein, is a subset of alkyl, in some embodiments preferred, and refers to a straight or branched chain hydrocarbon group containing from 1 to 4 carbon atoms. Representative examples of loweralkyl include, but are not limited to, methyl, ethyl, n-propyl, iso-propyl, n-butyl, iso-butyl, tert-butyl, and the like. The term "alkyl" or "loweralkyl" is intended to include both substituted and unsubstituted alkyl or loweralkyl unless otherwise indicated and these groups may be substituted with groups selected from halo, alkyl, haloalkyl, alkenyl, alkynyl, cycloalkyl, cycloalkylalkyl, aryl, arylalkyl, heterocyclo, heterocycloalkyl, hydroxyl, alkoxy, alkenyloxy, alkynyloxy, haloalkoxy, cycloalkoxy, cycloalkylalkyloxy, aryloxy, arylalkyloxy, heterocyclooxy, heterocycloalkyloxy, mercapto, alkyl-$S(O)_m$, haloalkyl-$S(O)_m$, alkenyl-$S(O)_m$, alkynyl-$S(O)_m$, cycloalkyl-$S(O)_m$, cycloalkylalkyl-$S(O)_m$, aryl-$S(O)_m$, arylalkyl-$S(O)_m$, heterocyclo-$S(O)_m$, heterocycloalkyl-$S(O)_m$, amino, carboxy, alkylamino, alkenylamino, alkynylamino, haloalkylamino, cycloalkylamino, cycloalkylalkylamino, arylamino, arylalkylamino, heterocycloamino, heterocycloalkylamino, disubstituted-amino, acylamino, acyloxy, ester, amide, sulfonamide, urea, alkoxyacylamino, aminoacyloxy, nitro or cyano where m=0, 1, 2 or 3.

"Alkylene" as used herein refers to a difunctional linear, branched or cyclic alkyl group, which may be substituted or unsubstituted, and where "alkyl" is as defined above.

"Alkenyl" as used herein alone or as part of another group, refers to a straight or branched chain hydrocarbon containing from 1 or 2 to 10, 20 or 50 carbon atoms (e.g., C1 to C4 alkenyl; C4 to C10 alkenyl; C11 to C50 alkenyl) (or in loweralkenyl 1 to 4 carbon atoms) which include 1 to 4 double bonds in the normal chain. Representative examples of alkenyl include, but are not limited to, vinyl, 2-propenyl, 3-butenyl, 2-butenyl, 4-pentenyl, 3-pentenyl, 2-hexenyl, 3-hexenyl, 2,4-heptadienyl, and the like. The term "alkenyl" or "loweralkenyl" is intended to include both substituted and unsubstituted alkenyl or loweralkenyl unless otherwise indicated and these groups may be substituted with groups as described in connection with alkyl and loweralkyl above.

"Alkenylene" as used herein refers to a difunctional linear, branched or cyclic alkyl group, which may be substituted or unsubstituted, and where "alkenyl" is as defined above.

"Alkynyl" as used herein alone or as part of another group, refers to a straight or branched chain hydrocarbon containing from 1 or 2 to 10, 20 or 50 carbon atoms (e.g., C1 to C4 alkynyl; C4 to C10 alkynyl; C11 to C50 alkynyl) (or in loweralkynyl 1 to 4 carbon atoms) which include 1 triple bond in the normal chain. Representative examples of alkynyl include, but are not limited to, 2-propynyl, 3-butynyl, 2-butynyl, 4-pentynyl, 3-pentynyl, and the like. The term "alkynyl" or "loweralkynyl" is intended to include both substituted and unsubstituted alkynyl or loweralknynyl unless otherwise indicated and these groups may be substituted with the same groups as set forth in connection with alkyl and loweralkyl above.

"Alkynylene" as used herein refers to a difunctional linear, branched or cyclic alkynyl group, which may be substituted or unsubstituted, and where "alkynyl" is as defined above.

"Alkylidene chain" as used herein refers to a difunctional linear, branched, and/or cyclic organic group, which may be substituted or unsubstituted, which may be saturated or unsaturated, and which may optionally contain one, two or three heteroatoms selected from the group consisting of N, O, and S. Examples include but are not limited to alkylene, alkenylene, alkynylene, arylene, alkarylene, and aralkylene. See, e.g., U.S. Pat. No. 6,946,533. The alkylidene chain may contain any suitable number of carbon atoms (e.g., a C1 to C4; C4 to C10; C10 to C20; C20 to C50).

"Alkoxy" as used herein alone or as part of another group, refers to an alkyl or loweralkyl group, as defined herein, appended to the parent molecular moiety through an oxy group, —O—. Representative examples of alkoxy include, but are not limited to, methoxy, ethoxy, propoxy, 2-propoxy, butoxy, tert-butoxy, pentyloxy, hexyloxy and the like.

"Acyl" as used herein alone or as part of another group refers to a —C(O)R radical, where R is any suitable substituent such as aryl, alkyl, alkenyl, alkynyl, cycloalkyl or other suitable substituent as described herein.

"Haloalkyl" as used herein alone or as part of another group, refers to at least one halogen, as defined herein, appended to the parent molecular moiety through an alkyl group, as defined herein. Representative examples of haloalkyl include, but are not limited to, chloromethyl, 2-fluoroethyl, trifluoromethyl, pentafluoroethyl, 2-chloro-3-fluoropentyl, and the like.

"Alkylthio" as used herein alone or as part of another group, refers to an alkyl group, as defined herein, appended to the parent molecular moiety through a thio moiety, as defined herein. Representative examples of alkylthio include, but are not limited to, methylthio, ethylthio, tert-butylthio, hexylthio, and the like.

"Aryl" as used herein alone or as part of another group, refers to a monocyclic carbocyclic ring system or a bicyclic carbocyclic fused ring system having one or more aromatic rings. Representative examples of aryl include, azulenyl, indanyl, indenyl, naphthyl, phenyl, tetrahydronaphthyl, and the like. The term "aryl" is intended to include both substituted and unsubstituted aryl unless otherwise indicated and these groups may be substituted with the same groups as set forth in connection with alkyl and loweralkyl above.

"Arylalkyl" as used herein alone or as part of another group, refers to an aryl group, as defined herein, appended to the parent molecular moiety through an alkyl group, as defined herein. Representative examples of arylalkyl include, but are not limited to, benzyl, 2-phenylethyl, 3-phenylpropyl, 2-naphth-2-ylethyl, and the like.

"Amino" as used herein means the radical —$NH_2$.

"Alkylamino" as used herein alone or as part of another group means the radical —NHR, where R is an alkyl group.

"Arylalkylamino" as used herein alone or as part of another group means the radical —NHR, where R is an arylalkyl group.

"Disubstituted-amino" as used herein alone or as part of another group means the radical —$NR_aR_b$, where $R_a$ and $R_b$ are independently selected from the groups alkyl, haloalkyl, alkenyl, alkynyl, cycloalkyl, cycloalkylalkyl, aryl, arylalkyl, heterocyclo, heterocycloalkyl.

"Acylamino" as used herein alone or as part of another group means the radical —$NR_aR_b$, where $R_a$ is an acyl group as defined herein and $R_b$ is selected from the groups hydrogen, alkyl, haloalkyl, alkenyl, alkynyl, cycloalkyl, cycloalkylalkyl, aryl, arylalkyl, heterocyclo, heterocycloalkyl.

"Acyloxy" as used herein alone or as part of another group means the radical —OR, where R is an acyl group as defined herein.

"Ester" as used herein alone or as part of another group refers to a —C(O)OR radical, where R is any suitable substituent such as alkyl, cycloalkyl, alkenyl, alkynyl or aryl, "Formyl" as used herein refers to a —C(O)H group.

"Carboxylic acid" as used herein refers to a —C(O)OH group.

"Sulfoxyl" as used herein refers to a compound of the formula —S(O)R, where R is any suitable substituent such as alkyl, cycloalkyl, alkenyl, alkynyl or aryl.

"Sulfonyl" as used herein refers to a compound of the formula —S(O)(O)R, where R is any suitable substituent such as alkyl, cycloalkyl, alkenyl, alkynyl or aryl.

"Sulfonate" as used herein refers to a compound of the formula —S(O)(O)OR, where R is any suitable substituent such as alkyl, cycloalkyl, alkenyl, alkynyl or aryl.

"Sulfonic acid" as used herein refers to a compound of the formula —S(O)(O)OH.

"Amide" as used herein alone or as part of another group refers to a —C(O)$NR_aR_b$ radical, where $R_a$ and $R_b$ are any suitable substituent such as H, alkyl, cycloalkyl, alkenyl, alkynyl or aryl.

"Sulfonamide" as used herein alone or as part of another group refers to a —$S(O)_2NR_aR_b$ radical, where $R_a$ and $R_b$ are any suitable substituent such as H, alkyl, cycloalkyl, alkenyl, alkynyl or aryl.

"Urea" as used herein alone or as part of another group refers to an —$N(R_c)C(O)NR_aR_b$ radical, where $R_a$, $R_b$ and $R_c$, are any suitable substituent such as H, alkyl, cycloalkyl, alkenyl, alkynyl or aryl.

"Alkoxyacylamino" as used herein alone or as part of another group refers to an —$N(R_a)C(O)OR_b$ radical, where $R_a$, $R_b$ are any suitable substituent such as H, alkyl, cycloalkyl, alkenyl, alkynyl or aryl.

"Aminoacyloxy" as used herein alone or as part of another group refers to an —OC(O)$NR_aR_b$ radical, where $R_a$ and $R_b$ are any suitable substituent such as H, alkyl, cycloalkyl, alkenyl, alkynyl or aryl.

"Cycloalkyl" as used herein alone or as part of another group, refers to a saturated or partially unsaturated cyclic hydrocarbon group containing from 3, 4 or 5 to 6, 7 or 8 carbons (which carbons may be replaced in a heterocyclic group as discussed below). Representative examples of cycloalkyl include, cyclopropyl, cyclobutyl, cyclopentyl, cyclohexyl, cycloheptyl, and cyclooctyl. These rings may be optionally substituted with additional substituents as described herein such as halo or loweralkyl. The term "cycloalkyl" is generic and intended to include heterocyclic groups as discussed below unless specified otherwise.

"Heterocyclic group" or "heterocyclo" as used herein alone or as part of another group, refers to an aliphatic (e.g., fully or partially saturated heterocyclo) or aromatic (e.g., heteroaryl) monocyclic- or a bicyclic-ring system. Monocyclic ring systems are exemplified by any 5 or 6 membered ring containing 1, 2, 3, or 4 heteroatoms independently selected from oxygen, nitrogen and sulfur. The 5 membered ring has from 0-2 double bonds and the 6 membered ring has from 0-3 double bonds. Representative examples of monocyclic ring systems include, but are not limited to, azetidine, azepine, aziridine, diazepine, 1,3-dioxolane, dioxane, dithiane, furan, imidazole, imidazoline, imidazolidine, isothiazole, isothiazoline, isothiazolidine, isoxazole, isoxazoline, isoxazolidine, morpholine, oxadiazole, oxadiazoline, oxadiazolidine, oxazole, oxazoline, oxazolidine, piperazine, piperidine, pyran, pyrazine, pyrazole, pyrazoline, pyrazolidine, pyridine, pyrimidine, pyridazine, pyrrole, pyrroline, pyrrolidine, tetrahydrofuran, tetrahydrothiophene, tetrazine, tetrazole, thiadiazole, thiadiazoline, thiadiazolidine, thiazole, thiazoline, thiazolidine, thiophene, thiomorpholine, thiomorpholine sulfone, thiopyran, triazine, triazole, trithiane, and the like. Bicyclic ring systems are exemplified by any of the above monocyclic ring systems fused to an aryl group as defined herein, a cycloalkyl group as defined herein, or another monocyclic ring system as defined herein. Representative examples of bicyclic ring systems include but are not limited to, for example, benzimidazole, benzothiazole, benzothiadiazole, benzothiophene, benzoxadiazole, benzoxazole, benzofuran, benzopyran, benzothiopyran, benzodioxine, 1,3-benzodioxole, cinnoline, indazole, indole, indoline, indolizine, naphthyridine, isobenzofuran, isobenzothiophene, isoindole, isoindoline, isoquinoline, phthalazine, purine, pyranopyridine, quinoline, quinolizine, quinoxaline, quinazoline, tetrahydroisoquinoline, tetrahydroquinoline, thiopyranopyridine, and the like. These rings include quaternized derivatives thereof and may be optionally substituted with groups selected from halo, alkyl, haloalkyl, alkenyl, alkynyl, cycloalkyl, cycloalkylalkyl, aryl, arylalkyl, heterocyclo, heterocycloalkyl, hydroxyl, alkoxy, alkenyloxy, alkynyloxy, haloalkoxy, cycloalkoxy, cycloalkylalkyloxy, aryloxy, arylalkyloxy, heterocyclooxy, heterocyclolalkyloxy, mercapto, alkyl-S(O)$_m$, haloalkyl-S(O)$_m$, alkenyl-S(O)$_m$, alkynyl-S(O)$_m$, cycloalkyl-S(O)$_m$, cycloalkylalkyl-S(O)$_m$, aryl-S(O)$_m$, arylalkyl-S(O)$_m$, heterocyclo-S(O)$_m$, heterocycloalkyl-S(O)$_m$, amino, alkylamino, alkenylamino, alkynylamino, haloalkylamino, cycloalkylamino, cycloalkylalkylamino, arylamino, arylalkylamino, heterocycloamino, heterocycloalkylamino, disubstituted-amino, acylamino, acyloxy, ester, amide, sulfonamide, urea, alkoxyacylamino, aminoacyloxy, nitro or cyano where m=0, 1, 2 or 3. Preferred heterocyclo groups include pyridyl and imidazolyl groups, these terms including the quaternized derivatives thereof, including but not limited to quaternary pyridyl and imidazolyl groups, examples of which include but are not limited to:

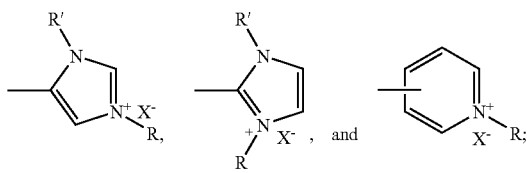

where R and R' are each a suitable substituent as described in connection with "alkyl" above, and particularly alkyl (such as methyl, ethyl or propyl), arylalkyl (such as benzyl), optionally substituted with hydroxy (—OH), phosphonic acid (—PO$_3$H$_2$) or sulfonic acid (—SO$_3$H), and X$^-$ is a counterion.

"Spiroalkyl" as used herein alone or as part of another group, refers to a straight or branched chain hydrocarbon, saturated or unsaturated, containing from 3 to 8 carbon atoms. Representative examples include, but are not limited to, —CH$_2$CH$_2$CH$_2$—, —CH$_2$CH$_2$CH$_2$CH$_2$—, —CH—)CH$_2$CH$_2$CH$_2$CH$_2$—, —CH$_2$CH$_2$CHCHCH$_2$—, —CH$_2$CH$_2$CH$_2$CH$_2$CH$_2$CH$_2$—, etc. The term "spiroalkyl" is intended to include both substituted and unsubstituted "spiroalkyl" unless otherwise indicated and these groups may be substituted with groups selected from halo, alkyl, haloalkyl, alkenyl, alkynyl, cycloalkyl, cycloalkylalkyl, aryl, arylalkyl, heterocyclo, heterocycloalkyl, hydroxyl, alkoxy, alkenyloxy, alkynyloxy, haloalkoxy, cycloalkoxy, cycloalkylalkyloxy, aryloxy, arylalkyloxy, heterocyclooxy, heterocycloalkyloxy, mercapto, alkyl-S(O)$_m$, haloalkyl-S(O)$_m$, alkenyl-S(O)$_m$, alkynyl-S(O)$_m$, cycloalkyl-S(O)$_m$, cycloalkylalkyl-S(O)$_m$, aryl-S(O)$_m$, arylalkyl-S(O)$_m$, heterocyclo-S(O)$_m$, heterocycloalkyl-S(O)$_m$, amino, alkylamino, alkenylamino, alkynylamino, haloalkylamino, cycloalkylamino, cycloalkylalkylamino, arylamino, arylalkylamino, heterocycloamino, heterocycloalkylamino, disubstituted-amino, acylamino, acyloxy, ester, amide, sulfonamide, urea, alkoxyacylamino, aminoacyloxy, nitro or cyano where m=0, 1 or 2.

Surface attachment groups used to carry out the present invention may be in protected or unprotected form. A surface attachment group may be a reactive group coupled directly to the active compound, or coupled to the active compound by means of an intervening linker "L". Linkers L can be aryl, alkyl, heteroaryl, heteroalkyl (e.g., oligoethylene glycol), peptide, polysaccharide, etc. Examples of surface attachment groups (with the reactive site or group in unprotected form) include but are not limited to alkene, alkyne, alcohol, thiol, selenyl, phosphono, telluryl, cyano, amino, formyl, halo, boryl, and carboxylic acid surface attachment groups. In addition to the monodentate linker-surface attachment groups described above, multidentate linkers can be employed. Tripodal linkers bearing thiol, carboxylic acid, alcohol, or phosphonic acid units are particularly attractive. Specific examples of such linkers are described in Balakumar, Muthukumaran and Lindsey, U.S. patent application Ser. No. 10/867,512 (filed Jun. 14, 2004). See also Lindsey, Loewe, Muthukumaran, and Ambroise, US Patent Application Publication No. 20050096465 (Published May 5, 2005), particularly paragraph 51 thereof.

"Auxochrome" as used herein is any substituent on a porphyrinic macrocyle that may be used to modify or spectrally tune the molecule. Examples include ethyne, vinyl, carbomethoxy, and acetyl, with ethyne and vinyl substituents particularly preferred because of their lack of hydrogen-bonding features that could interfere with the self-assembly process.

"Porphyrinic macrocycle" refers to a porphyrin or porphyrin derivative, and are discussed in greater detail below.

The disclosures of all United States patent references cited herein are to be incorporated by reference herein in their entirety.

1. Porphyrinic Macrocycles.

Porphyrinic macrocycles that may be used to carry out the present invention include didehydrophorbines, phorbines ((including opp-phorbines)), and bacteriophorbines. In some embodiments, porphyrinic macrocycle compounds useful for carrying out the present invention include compounds of general Formula I:

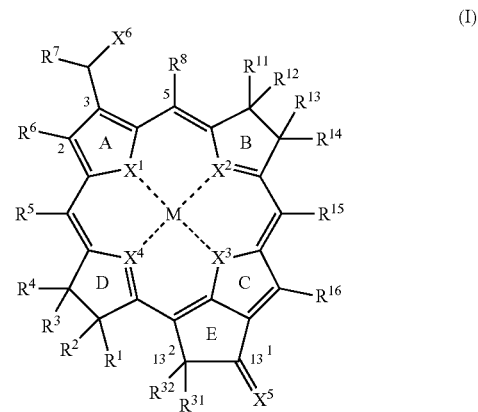

with particular embodiments of the foregoing including:
(a) 17,18-didehydrophorbines of Formula Ia:

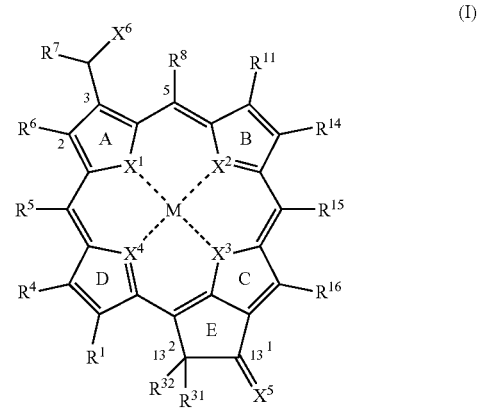

(b) phorbines (including opp-phorbines) of Formula Ib and Ib' (where Formula Ib' represents the opp-phorbines):

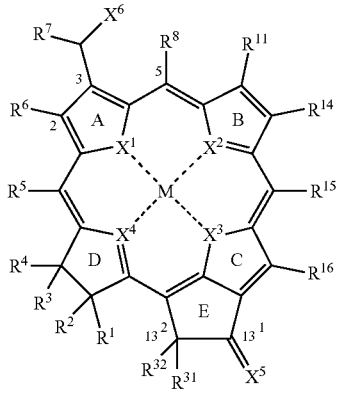

(Ib)

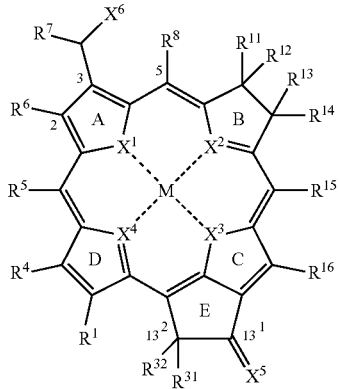

(Ib')

and:
(c) bacteriophorbines of Formula Ic:

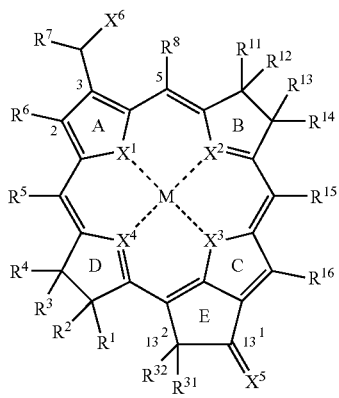

(Ic)

wherein:
M is a metal;
$X^1$, $X^2$, $X^3$ and $X^4$ are each independently selected from the group consisting of Se, NH, $CH_2$, O and S;
$X^5$ is O or S;
$X^6$ is OH, SH, or $NR^{41}R^{42}$;
$R^1$, $R^2$, $R^3$, $R^4$, $R^5$, $R^6$, $R^7$, $R^8$, $R^{11}$, $R^{12}$, $R^{13}$, $R^{14}$, $R^{15}$, $R^{16}$, $R^{31}$, $R^{32}$, $R^{41}$ and $R^{42}$ are each independently selected from the group consisting of H, alkyl, alkenyl, alkynyl, cycloalkyl, cycloalkylalkyl, cycloalkylalkenyl, cycloalkylalkynyl, heterocyclo, heterocycloalkyl, heterocycloalkenyl, heterocycloalkynyl, aryl, aryloxy, arylalkyl, arylalkenyl, arylalkynyl, heteroaryl, heteroarylalkyl, heteroarylalkenyl, heteroarylalkynyl, alkoxy, halo, mercapto, azido, cyano, acyl, formyl, carboxylic acid, acylamino, ester, amide, hydroxyl, nitro, alkylthio, amino, alkylamino, arylalkylamino, disubstituted amino, acyloxy, sulfoxyl, sulfonyl, sulfonate, sulfonic acid, sulfonamide, urea, alkoxylacylamino, aminoacyloxy, surface attachment groups, and auxochromes;
wherein each pair of $R^1$ and $R^2$, $R^3$ and $R^4$, $R^{11}$ and $R^{12}$, $R^{13}$ and $R^{14}$ or $R^{31}$ and $R^{32}$, can together form =O;
wherein each of $R^1$ and $R^2$, $R^3$ and $R^4$, $R^{11}$ and $R^{12}$, or $R^{13}$ and $R^{14}$, can together form spiroalkyl;
wherein $R^2$ and $R^3$ can together form a double bond; and wherein $R^{12}$ and $R^{13}$ can together form a double bond;
or a salt thereof.

Some embodiments are subject to the proviso that: (i) neither $R^1$ nor $R^2$ is H; or neither $R^3$ nor $R^4$ is H; or neither $R^{11}$ nor $R^{12}$ is H; or neither $R^{13}$ nor $R^{14}$ is H.

In some embodiments, $R^1$ and $R^2$ are both independently selected from the group consisting of alkyl, alkenyl, alkynyl, cycloalkyl, cycloalkylalkyl, cycloalkylalkenyl, cycloalkylalkynyl, aryl, arylalkyl, arylalkenyl, and arylalkynyl; or
$R^3$ and $R^4$ are both independently selected from the group consisting of alkyl, alkenyl, alkynyl, cycloalkyl, cycloalkylalkyl, cycloalkylalkenyl, cycloalkylalkynyl, aryl, arylalkyl, arylalkenyl, and arylalkynyl; or
$R^{11}$ and $R^{12}$ are both independently selected from the group consisting of alkyl, alkenyl, alkynyl, cycloalkyl, cycloalkylalkyl, cycloalkylalkenyl, cycloalkylalkynyl, aryl, arylalkyl, arylalkenyl, and arylalkynyl; or
$R^{13}$ and $R^{14}$ are both independently selected from the group consisting of alkyl, alkenyl, alkynyl, cycloalkyl, cycloalkylalkyl, cycloalkylalkenyl, cycloalkylalkynyl, aryl, arylalkyl, arylalkenyl, and arylalkynyl.

In some embodiments, $R^1$ and $R^2$ are both independently selected from the group consisting of alkyl, cycloalkyl, aryl, and arylalkyl; or
$R^3$ and $R^4$ are both independently selected from the group consisting of alkyl, cycloalkyl, aryl, and arylalkyl; or
$R^{11}$ and $R^{12}$ are both independently selected from the group consisting of alkyl, cycloalkyl, aryl, and arylalkyl; or
$R^{13}$ and $R^{14}$ are both independently selected from the group consisting of alkyl, cycloalkyl, aryl, and arylalkyl.

In some embodiments, neither $R^1$ nor $R^2$ is H.
In some embodiments, neither $R^3$ nor $R^4$ is H.
In some embodiments, none of $R^1$, $R^2$, $R^3$ and $R^4$ is H.
In some embodiments, neither $R^{11}$ nor $R^{12}$ is H.
In some embodiments, neither $R^{13}$ nor $R^{14}$ is H.
In some embodiments, none of $R^{11}$, $R^{12}$, $R^{13}$ and $R^{14}$ is H.

In general, compounds of Formula I as described above may be produced by (a) providing a compound of Formula II:

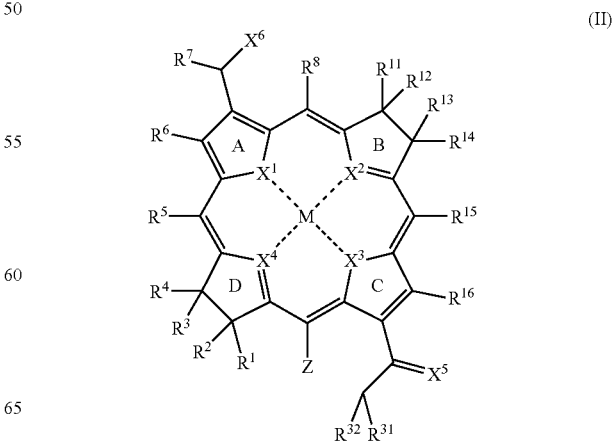

(II)

wherein: Z is H or halo (such as bromo); and M, $X^1$, $X^2$, $X^3$, $X^4$, $X^5$, $X^6$, $R^1$, $R^2$, $R^3$, $R^4$, $R^5$, $R^6$, $R^7$, $R^8$, $R^{11}$, $R^{12}$, $R^{13}$, $R^{14}$, $R^{15}$, $R^{16}$, $R^{31}$ and $R^{32}$ are as given above;

(b) cyclizing said compound of Formula II, typically by an intramolecular alpha arylation, to produce a cyclized product (that is, including the "E" ring as shown in I); and (c) optionally deoxygenating the cyclized product; and then (d) optionally metalating the cyclized product to produce the compound of Formula I. In some embodiments, $R^{31}$ and $R^{32}$ are each independently H, alkyl, or aryl; or one of $R^{31}$ and $R^{32}$ is H and the other is cyano; or one of $R^{31}$ and $R^{32}$ is H and the other is ester.

The cyclizing step is generally carried out in an organic solvent, optionally including water, by any suitable technique as discussed further below. For example, the cyclizing step may be carried out with a palladium catalyst in the presence of a base.

The compound of Formula II may be produced by halogenating a compound of Formula III:

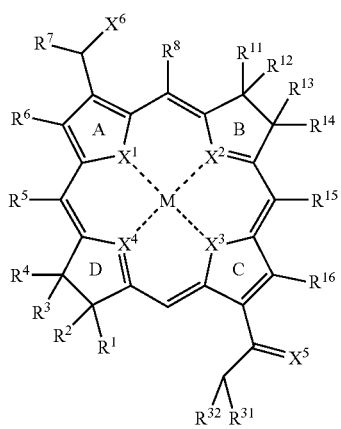

(III)

wherein M, $X^1$, $X^2$, $X^3$, $X^4$, $X^5$, $X^6$, $R^1$, $R^2$, $R^3$, $R^4$, $R^5$, $R^6$, $R^7$, $R^8$, $R^{11}$, $R^{12}$, $R^{13}$, $R^{14}$, $R^{15}$, $R^{16}$, $R^{31}$ and $R^{32}$ are as given above. The compound of Formula III can be produced in accordance with known techniques or variations thereof which will be apparent to those skilled in the art based upon the present disclosure.

Intramolecular α-arylation (Pd-coupling): The intennolecular and intramolecular α-arylation of certain ketones with a halo group (e.g., Cl, Br, J) is known. The intramolecular cyclization step of the present invention can be carried out in like manner, or variations thereof that will be apparent to those skilled in the art in view of the present disclosure.

In general the reaction involves a palladium catalyst and a base. Suitable palladium-catalysts include, but are not limited to, Pd$_2$(dba)$_3$/BINAP, Pd$_2$(dba)$_3$/Tol-BINAP, Pd(OAc)$_2$, Pd$_2$(dba)$_3$, Pd$_2$(dba)$_3$/2-(dicyclohexylphosphino)-biphenyl, Pd(OAc)$_2$/2-(dicyclohexylphosphino)-biphenyl, Pd(OAc)$_2$/2-(di-t-butylphosphino)-2'-methylbiphenyl, Pd(dba)$_2$/DTPE, Pd(dba)$_2$/DPPF, Pd(OAc)$_2$/Xantphos, Pd(OAc)$_2$/n-butylbis(1-adamantyl)-phosphine, Pd(dba)$_2$/n-butylbis(1-adamantyl)-phosphine, Pd(OAc)$_2$/PPh$_3$, Pd(OAc)$_2$/(4-XC$_6$H$_4$)$_3$P, Pd$_2$(dba)$_3$/Xantphos, Pd(OAc)$_2$/2-(dicyclohexylphosphino)-2'-methylbiphenyl, Pd(OAc)$_2$/DPPP, PdCl$_2$(Ph$_3$P)$_2$, PdCl$_2$[(o-Tol)$_3$]$_2$, Pd(Ph$_3$P)$_4$, Pd(OAc)$_2$/ P(t-Bu)$_3$, Pd$_2$(dba)$_3$/CHCl$_3$/BINAP, and combinations thereof.

Suitable bases include, but are not limited to, t-BuONa, NaN(SiMe$_3$)$_2$, KN(SiMe$_3$)$_2$, Cs$_2$CO$_3$, K$_2$CO$_3$, K$_3$PO$_4$, diisopropylamine, NaH, NaOH, t-BuOK, TBAF, and combinations thereof.

Any suitable organic solvent, including polar and nonpolar, and protic or aprotic solvents, may be used for the reaction, optionally including water, with examples including but not limited to THF, toluene, benzene, xylene, DMF, dioxane, DMSO, 1-butyl-3-methylimidazolium tetrafluoroborate, and combinations thereof. The reaction may be carried out at any suitable temperature, typically from 20 or 40° C. tip to 140° C., or more.

See, e.g., Muratake, H. et al., *Tetrahedron Lett.* 1997, 38, 7577-7580; Muratake, H.; Natsume, M. *Tetrahedron Lett.* 1997, 38, 7581-7582; Muratake, H.; Nakai, H. *Tetrahedron Lett.* 1999, 40, 2355-2358; Muratake, H. et al., *Tetrahedron* 2004, 60, 11783-11803; Sole, D. et al., *Adv. Synth. Catal.* 2001, 343, 439-442; Sole, D. et al., *J. Am. Chem. Soc.* 2003, 125, 1587-1594; Sole, D. et al., *Chem. Commun.* 2001, 1888-1889; Sole, D. et al., *Org. Lett.* 2000, 2, 2225-2228; Ciufolini, M. A. et al., *J. Org. Chem.* 1988, 53, 4151-4153; Honda, T.; Sakamaki, Y. *Tetrahedron Lett.* 2005, 46, 6823-6825; See also, Palucki, M.; Buchwald, S. L. *J. Am. Soc. Chem.* 1997, 119, 11108-11109; Fox, J. M. et al., *J. Am. Soc. Chem.* 2000, 122, 1360-1370; Hamann, B. C.; Hartwig, J. F. *J. Am. Soc. Chem.* 1997, 119, 12382-12383; Carril, M. et al., *Org. Lett.* 2005, 22, 4787-4789; Ehrentraut, A. et al., *Adv. Synth. Catal.* 2002, 344, 209-217; Satoh, T. et al., *J. Organomet. Chem.* 2002, 653, 161-166; Wills, M. C. et al., *Angew. Chem. Int. Ed.* 2005, 44, 403-406; Diedrichs, N. et al., *Eur. J. Org. Chem.* 2005, 1731-1735; Mo, J. et al., *Tetrahedron* 2005, 61, 9902-9907; Singh, R.; Nolan, S. P. *J. Organomet. Chem.* 2005, 690, 5832-5840; Kosugi, M. et al., *J. Chem. Soc., Chem. Commun.* 1983, 344-345; Kuwajima, I.; Urabe, H. *J. Am. Soc. Chem.* 1982, 104, 6831-6833.

An efficient reaction condition was reported for the direct arylation of ketones by the use of aryl chlorides in the presence of the carbene-palladium catalyst [(Pd(OAc)$_2$/N,N'-(2,6-diisopropylphenyl)imidazole-2-ylidene] (Singh, R.; Nolan, S. P. *J. Organomet. Chem.* 2005, 690, 5832-5840), and the cyclizing step of the present invention can be carried out in like manner. Alternatively, the reaction of tributyltin enolates, prepared either from tributyltin methoxide and enol acetates or from silyl enol ethers and Bu$_3$SnF, in the presence of PdCl$_2$[P(o-tolyl)$_3$]$_2$ is reported to give α-arylated ketones (Kuwajima, I.; Urabe, H. *J. Am. Soc. Chem.* 1982, 104, 6831-6833), and the cyclizing step of the present invention can be carried out in like manner.

Photodriven nucleophilic aromatic substitution reaction: The α-arylation of ketones (intermolecular or intramolecular) has been studied by photostimulated nucleophilic aromatic substitution reaction of enolate anions with aryl halides, and the cyclizing step of the present invention can be carried out in like manner. The reaction is generally carried out in the presence of a base (suitable examples including but not limited to t-BuOK, KNH$_2$, NaNH$_2$, K, Na, Li, KH, Ag$_2$O, and mixtures thereof) in an organic solvent (suitable examples including but not limited to (liquid ammonia, THF, DME, ether, DMF, DMSO, benzene are commonly used solvents).

Still another approach for the intramolecular α-arylation of ketones involves the reaction of silyl enol ethers with the PET-generated arene radical cations.

See, e.g., Rossi, R. A.; Bunnett, J. F. *J. Org. Chem.* 1973, 38, 3020-3025; Bunnett, J. F.; Sundberg, J. E. *J. Org. Chem.* 1976, 41, 1702-1706; Komin, A. P.; Wolfe, J. F. *J. Org. Chem.* 1977, 42, 2481-2486; Moon, M. P.; Wolfe, J. F. *J. Org. Chem.* 1979, 44, 4081-4085; Sommelhack, M. F.; Bargar, T. M. *J. Org. Chem.* 1977, 42, 1481-1482; Semmelheck, M. F.; Bargar, T. *J. Am. Soc. Chem.* 1980, 102, 7765-7774; Pandey, G.; Karthikeyan, M.; Murugan, A. *J. Org. Chem.* 1998, 63, 2867-2872.

Other methods for α-arylation: A number of alternative routes have also been reported for the α-arylation of ketones, and the cyclizing step of the present invention can be carried out in like manner. For example:

(i) A nucleophilic aromatic substitution via Ni(II) catalyzed reaction of aryl halides with ketones has been reported (See, e.g., Semmelhack, M. F.; Stauffer, R. D.; Rogerson, T. D. *Tetrahedron Lett.* 1973, 4519-4522).

(ii) An alternative approach for the intramolecular α-arylation without halo substituents has been achieved with a Mn(III) catalyst (See, e.g., Snider, B. B.; Cole, B. M. *J. Org. Chem.* 1995, 60, 5376-5377).

(iii) The electroreductive intramolecular cyclization of a carbonyl group to an activated carbon-carbon double bond has been described (no aryl halide is involved here) (See, e.g., Kise, N.; Suzumoto. T.; Shono, T. *J. Org. Chem.* 1994, 59, 1407-1413).

(iv) The electrophilic aromatic substitution of β-keto sulfoxides or tris(phenylthio)methane derivatives in the presence of an acid is known to give α-arylated ketones (no aryl halide is involved here) (See, e.g., Oikawa, Y.; Yonemitsu, O. *Tetrahedron* 1974, 30, 2653-2660; Oikawa, Y.; Yonemitsu, O. *J. Org. Chem.* 1976, 41, 1118-1124; Tamura, Y. et al., *Tetrahedron Lett.* 1981, 22, 81-84; Bin Manas, A. R.; Smith, R. A. *J. Tetrahedron* 1987, 43, 1856-1856).

In a particular embodiment, our synthetic route for installing the isocyclic ring entails four steps in addition to those required for macrocycle formation. The route is illustrated for chlorins in Scheme 6, with substituents omitted for clarity.

Step 1: introduction of a halogen, preferably a bromine atom, at the 8-position of an Eastern half precursor to the chlorin (not shown). (Note that the Eastern half ordinarily incorporates a bromine atom at the 9-position for macrocycle formation; hence, the Eastern half used herein contains two bromine substituents.) The chlorin macrocycle is then formed in the usual way, affording the corresponding 13-bromo-chlorin (Br$^{13}$-chlorin).

Step 2: Pd coupling with tributyl(ethoxyvinyl)tin, which upon acidic workup affords the corresponding 13-acetyl-chlorin (Ac$^{13}$-chlorin).

Step 3: Halogenation of the chlorin, which occurs preferentially at the 15-position, affording the 13-acetyl-15-halo-chlorin (Ac$^{13}$X$^{15}$-chlorin). Bromination is preferred. Note that the sites flanking the reduced, pyrroline ring are more reactive than any other sites in the macrocycle. The preference for 15- versus 20-substitution stems from steric hindrance imparted by the geminal dimethyl group at the 18-position.

Step 4: Intramolecular α-arylation via Pd coupling, which creates a carbon-carbon bond between the methyl group of the acetyl moiety, and the meso (C$^{15}$) carbon, yielding the 13$^1$-oxophorbine.

An analogous approach is employed for the synthesis of porphyrins or bacteriochlorins bearing an isocyclic ring. A β-halo-dipyrromethane or dihydrodipyrrin precursor is prepared and employed to give the corresponding 13-halo-porphyrin or bacteriochlorin. The remaining steps 2-4 proceed as shown for the chlorin.

The keto group can be deoxygenated to give the phorbine (not shown). Typical methods of deoxygenation include (1) TFA/NaBH$_4$, or (2) reduction with LiAlH$_4$ (Abraham et al., *J. Chem. Soc. Perkin Trans.* 2, 1993, 1047-1059), or (3) reduction with LiAlH$_4$, tosylation, and reduction with LiAlH$_4$. Abraham et al. found that a chlorophyll analogue underwent deoxygenation upon treatment with LiAlH$_4$. A wide variety of other methods are known for deoxygenation of ketones.

Scheme 6

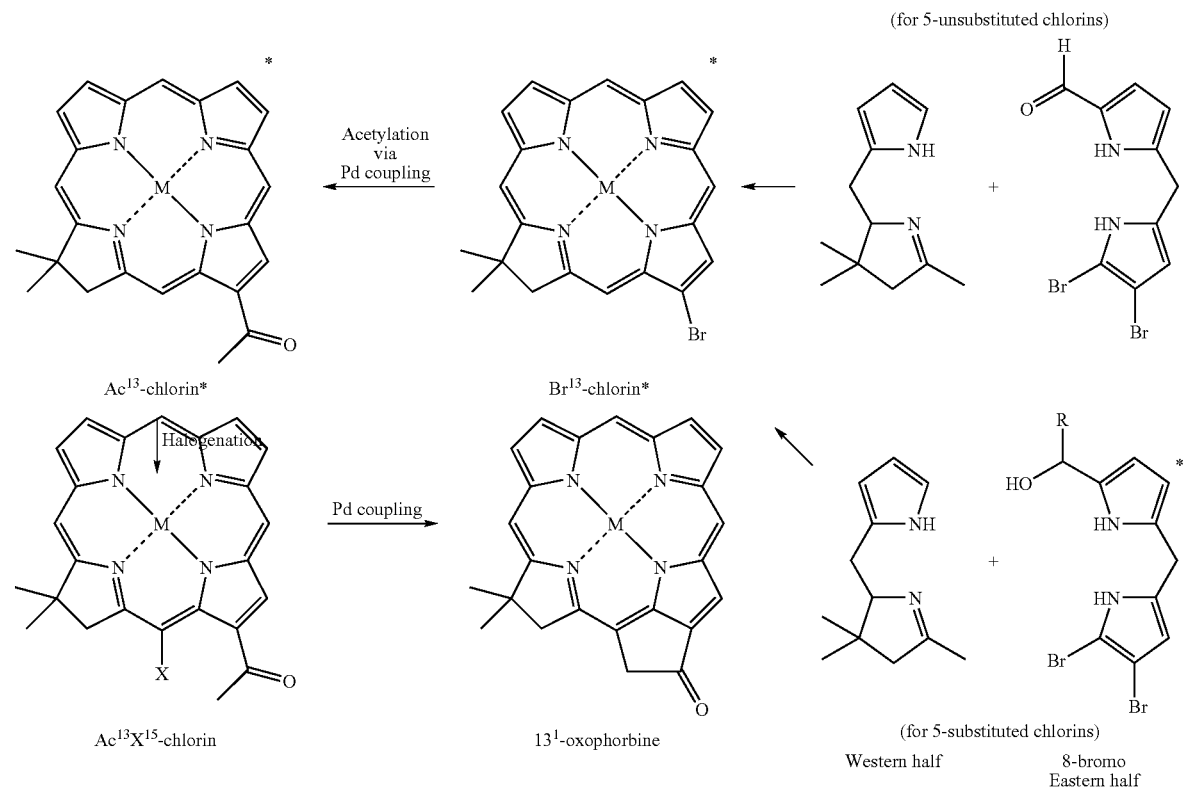

Compounds marked with asterisk "*" have been previously disclosed in lectures/poster presentation Porphyrinic compounds as described above may be metalated with any suitable metal in accordance with known techniques. See, e.g., U.S. Pat. No. 6,208,553. Suitable metals are generally divalent metals, and preferably those having a fifth coordination site, or trivalent metals. Examples of suitable divalent metals include but are not limited to zinc magnesium, and tin; examples of suitable trivalent metals include but are not limited to aluminum, gold, and indium.

It is to be understood that the compounds provided herein may contain chiral centers. Such chiral centers may be of either the (R) or (S) configuration, or may be a mixture thereof. Thus, the compounds provided herein may be enantiomerically pure, or be stereoisomeric or diastereomeric mixtures. It is to be understood that the chiral centers of the compounds provided herein may undergo epimerization. As such, one of skill in the art will recognize that use of a compound in its (R) form is equivalent, for compounds that undergo epimerization, to a use of the compound in its (S) form.

Stability. An advantage of some embodiments of compounds of the present invention is their stability and absorption characteristics. Thus, the present invention provides a "neat" composition consisting of an active compound of the invention (e.g., compounds of Formula I, wherein the composition has or is characterized by a peak Molar absorption coefficient in solution of at least 10,000, up to 300,000 $M^{-1}$ $cm^{-1}$ or more, at a wavelength between 200 and 850 or 900 nanometers (it being understood that (a) the active compound must be placed into solution to determine its peak Molar absorption coefficient at the indicated wavelength; and (b) the compound may exhibit additional peaks outside of this range, or multiple peaks within this range).

In addition, the present invention provides compositions comprising or consisting essentially of an active compound of the invention (e.g., compounds of Formula I), in a solvent. The amount of solvent is not critical and may comprise from 0.01 or 1 to 99 or 99.99 percent by weight of the composition. The composition has or is characterized by a peak Molar absorption coefficient in solution of at least 10,000, up to 300,000 $M^{-1}$ $cm^{-1}$ or more, at a wavelength between 200 and 850 or 900 nanometers. It will be appreciated that agitation may be required to break agglomerated particles back into solution prior to determining the molar absorption, but that some level of agglomeration may actually be desired for practical use of the composition. Suitable solvents depend upon the particular compound and intended use for that compound, but include both organic solvents, aqueous solvents and combinations thereof.

The compositions, be they the compounds in "neat" form or the compounds mixed with a solvent, have or exhibit a loss of not more than 10, 15 or 20 percent by weight of the compound of the invention (due to degradation thereof) when stored in a sealed vessel (e.g., a flask ampoule or vial), at room temperature in the absence of ambient light for at least 3 or 4 months. Degradation can be determined by spectroscopy, thin-layer chromatography, NMR spectroscopy, and/or mass spectrometry, in accordance with known techniques.

Solubility. An advantage of some embodiments of compounds of the invention is their solubility. Thus the present invention provides compositions, including but not limited to compositions, comprising, consisting of or consisting essentially of: (a) an aqueous solvent (for example, distilled water, saline solution, buffer solution); and (b) from 1, 2, 5 or 10 microMolar up to 200, 300, or 500 milliMolar of an active compound as described herein solubilized in the aqueous solvent.

Solar cells of the present invention may be made by any suitable technique, such as by: (a) providing a semiconductor charge separation material; (b) coating the semiconductor charge separation material with the porphyrinic macrocycle (e.g., under conditions in which the porphyrinic macrocycles self-assemble to form the light-harvesting film thereon); and (c) connecting the at least one electrode to the semiconductor p region (which may be done before or after the coating step). Optionally, the layer of porphyrinic macrocycles directly on the charge separation material may be coupled thereto by means of surface attachment groups substituted on the charge separation material.

Any suitable semiconductor charge separation material may be used. See, e.g., U.S. Pat. No. 6,998,285. The charge separation material may, for example, be an inorganic semiconductor, an organic semiconductor (including polymers and crystalline materials), or a composite thereof, which may be configured in any structural form (e.g., sheets, columns, etc.). In preferred embodiments the charge separation material comprises a p region and an n region. The semiconductor material may be "pixilated" or divided into discrete regions if desired so that defects in one region do not adversely influence other regions.

The coating step can be carried out by any suitable technique, such as physical vapor deposition, chemical vapor deposition, spin coating, dip coating, spraying, ink-jet printing, or casting. See, e.g., U.S. Pat. No. 7,063,900. Where multiple distinct layers are applied to achieve the architecture described above, the coating step can be repeated as necessary to achieve the desired end product. Where the semiconductor material comprises an n region and a p region, in some embodiments the light harvesting film is coated on the n region, and in some embodiments the light harvesting film is coated on the p region. Preferably, the light-harvesting film is deposited in a manner so that it has a maximum peak absorption between 200, 300 or 400 up to 800, 1000, or 1200 nanometers in the solar cell.

In some embodiments, the light-harvesting film comprises at least one layer selected from the group consisting of a didehydrophorbine layer, a phorbine layer, and a bacteriophorbine layer. Note that not all molecules in a particular layer need be identical (even though, in some preferred embodiments, a particular layer may consist essentially of didehydrophorbines, phorbines, or bacteriophorbines): A mixture of different molecules having different absorption properties can be included in a single layer; a plurality of immediately distinct but adjacent layers of one particular structure (didehydrophorbine, phorbine, or bacteriophorbine), but with different substitution patterns (and/or different ratios or blends of molecules of a particular structure) can be utilized, etc. With respect to the primary core structure within different layers, the layers are preferably arranged with one another, and with the charge separation material, in the order of: the didehydrophorbine layer (when present), the phorbine layer (when present), the bacteriophorbine layer (when present), and then the charge separation material, so that charge is transferred in a (preferably substantially irreversible) manner from layer to layer and from the final layer to the charge separation material.

Some or all of the aforesaid layers may be included in a particular device, with the example shown in FIG. 1 including all three different layers:didehydrophorbine 11, phorbine 12 and bacteriophorbine 13 on a charge separation material 14, to which electrodes 15, 16 are electrically coupled. Alternatively, in some embodiments the light-harvesting film comprises or consists essentially of a didehydrophorbine layer and an oxophorbine layer; in some embodiments the light-harvesting film comprises or consists essentially of a didehydrophorbine layer and a bacteriophorbine layer; and in some embodiments the light-harvesting film comprises or consists essentially of a phorbine layer and a bacteriophorbine layer.

Figure 2:
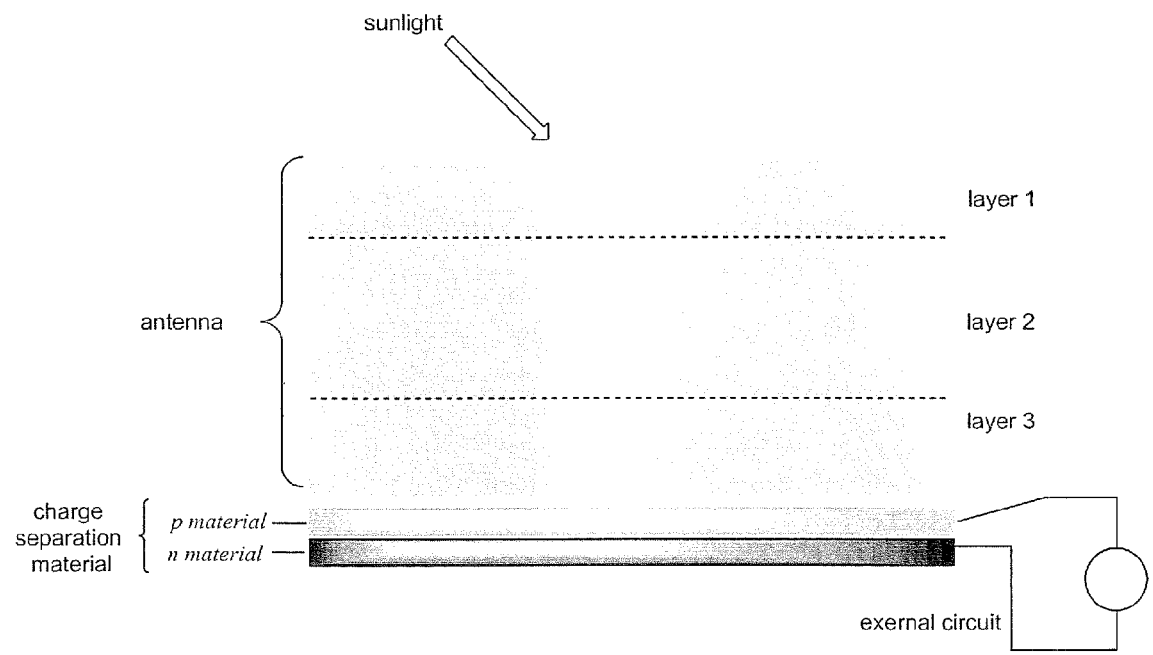
FIG. 2 schematically illustrates one embodiment of a solar cell of the present invention, with three different layers in the light harvesting film and electrodes connected to the p layer and n layer of the semiconductor charge separation material. (space between materials for clarity only).
Figure 3:
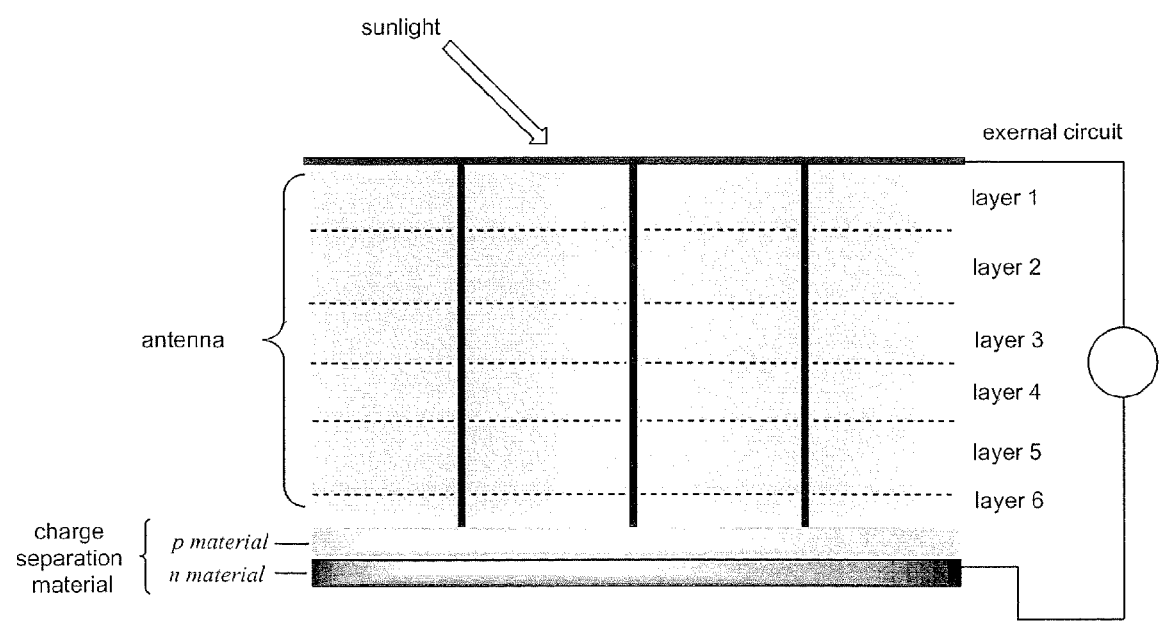
FIG. 3 schematically illustrates a second embodiment of a solar cell of the present invention, with the light harvesting film having six layers, and an electrical contact to the charge separation material being achieved by "punch-through" of electrodes through the light harvesting film.

Electrodes can be coupled to the charge separation material by any suitable technique. For example, in some embodiments and as illustrated in FIGS. 2-3, at least one electrode can then be connected to the p region, and at least one electrode can be connected to the n region. Electrode connections can be made to the semiconductor directly or indirectly by any suitable technique as long as the transfer of charge therethrough is achieved. The final structural configuration of the solar cell, including (where desired) substrates, electrodes, protective coverings, and further electrical contacts and mounting members, is not critical and numerous configurations thereof will be readily apparent to those skilled in the art based upon prior approaches and the present disclosure. See, e.g., U.S. Pat. Nos. 7,019,209; 6,936,761; 6,911,667; 6,825,409; 6,809,252; and 6,696,739.

The present invention is explained in greater detail in the following non-limiting Examples.

Example 1

Synthesis of Chlorins and Bacteriochlorins Equipped for Self-Assembly into Light-Harvesting Architectures Syntheses of stable chlorins and bacteriochlorins. We recently developed a concise route to bacteriochlorins that are stable to dehydrogenation (Scheme 7).[57] An aldehyde A undergoes Knoevenagel reaction with monoethyl malonate to give the ethyl cinnamate B. The latter reacts with p-tosylmethylisocyanide to give the pyrrole C, which decarboxylates at elevated temperature to give the 3-substituted pyrrole D. Vilsmeier formylation gives the 2-formylpyrrole E (the 5-formylpyrrole also is formed and must be removed). The 2-formylpyrrole E undergoes nitro-aldol condensation; reduction of the nitrovinyl-pyrrole affords nitroethyl-pyrrole F. Michael addition with an acetal derivative of mesityl oxide (G, available from mesityl oxide) affords the nitro-hexanone-pyrrole H. Reductive cyclization of H affords the acetal-substituted dihydrodipyrrin I bearing the geminal dimethyl lock. The identification of the acetal-substituted dihydrodipyrrin as a suitable substrate for bacteriochlorin formation emerged from several years of work.

The acetal-substituted dihydrodipyrrin I undergoes acid-catalyzed self-condensation at room temperature to give the bacteriochlorin. Note that no oxidant is required in this reaction. The route to date has been demonstrated with Ar=p-tolyl (also with 4-iodophenyl). The course of reaction and ultimate yield depend on the nature of the condensation conditions. With catalysis by $BF_3$-etherate in $CH_3CN$ at room temperature, two free base bacteriochlorins are obtained in 41% yield MeO—BC, $R^5$=OMe, 30% yield; H—BC, $R^5$=H, 11% yield). Work in progress suggests that the ratio of the two bacteriochlorins can be altered by modification of reaction parameters. Regardless, the two bacteriochlorins are readily separated. A key design feature in the bacteriochlorin is the presence of the geminal dimethyl groups, which lock-in the hydrogenation level of the two pyrroline rings. This design feature precludes adventitious dehydrogenation and reversion to the chlorin or porphyrin.

Scheme 7. Synthesis of dehydrogenation resistant bacteriochlorins.

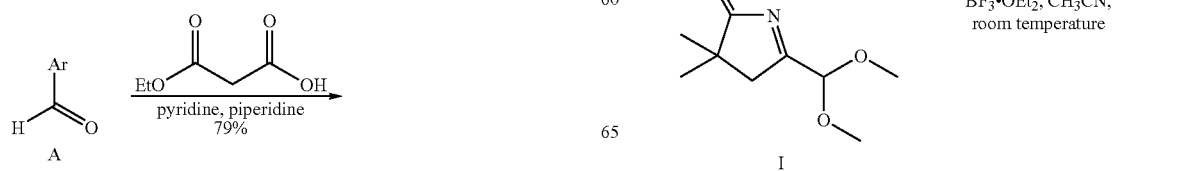

-continued

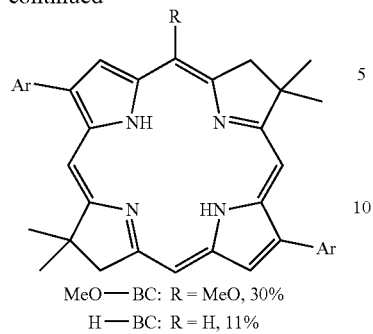

MeO—BC: R = MeO, 30%
H—BC: R = H, 11%

Ar = p-tolyl

In summary, a relatively short synthesis affords a dihydrodipyrrin-acetal that undergoes self-condensation under mild conditions to give two readily separable bacteriochlorins. Each bacteriochlorin bears a pair of geminal dimethyl groups that lock-in the bacteriochlorin (tetrahydroporphyrin) hydrogenation level, identical substituents at diametrically opposed 2,12-positions, and the presence or absence of a methoxy group at the 5-position. The bacteriochlorins are stable to acid, base, elevated temperature, standing in solution under room lighting under aerobic conditions for 10 days, chromatography in the presence of light and air, etc. The ease of preparation, stability, and characteristic spectral features make the synthetic bacteriochlorins well suited for a wide variety of applications.

Prior to the development of the bacteriochlorin synthesis, we developed a synthesis of stable chlorins.[52-54] We recently extended this route to gain access to $13^1$-oxophorbines.[55] The synthesis is shown in Scheme 8. The early stage of the synthesis creates the chlorin macrocycle, then acetylation, bromination, and α-arylation install the isocyclic ring.

Scheme 8. Synthesis of a $13^1$-oxophorbine.

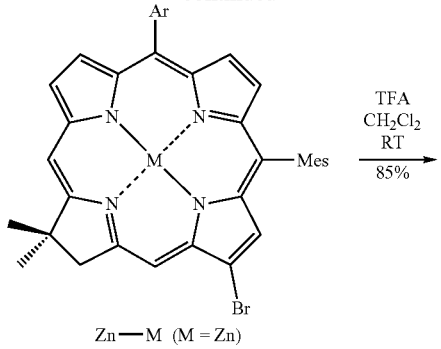

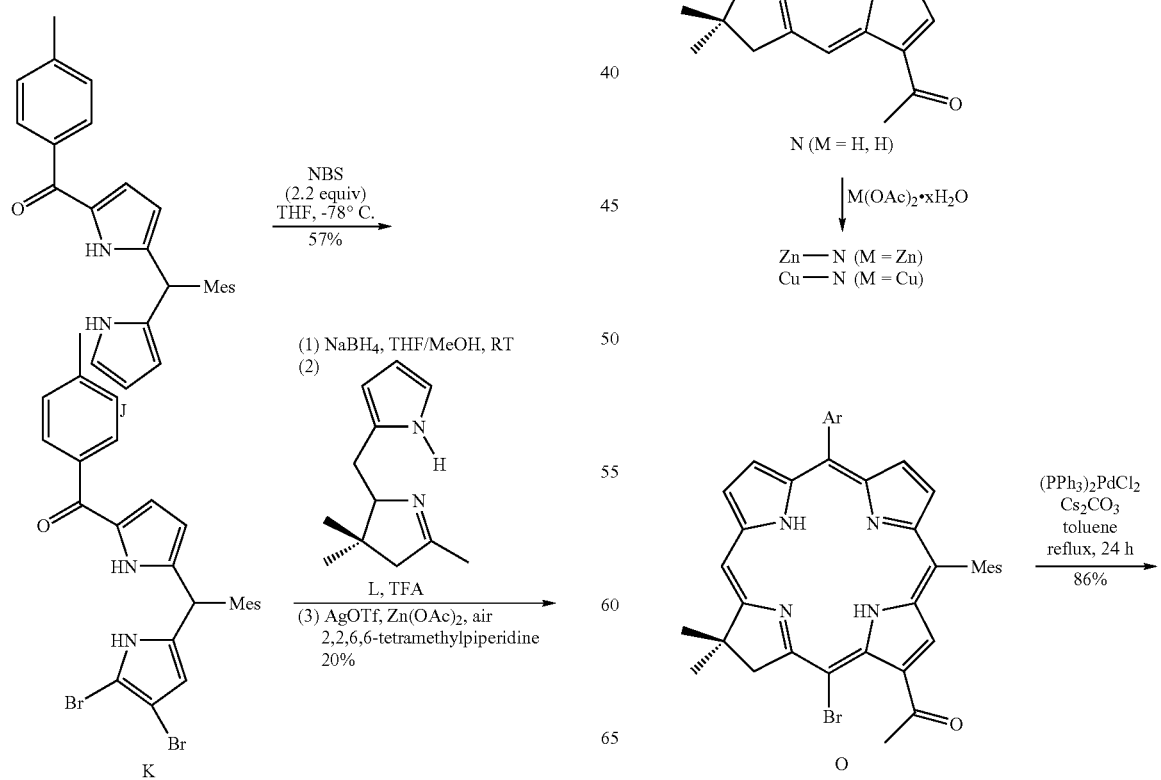

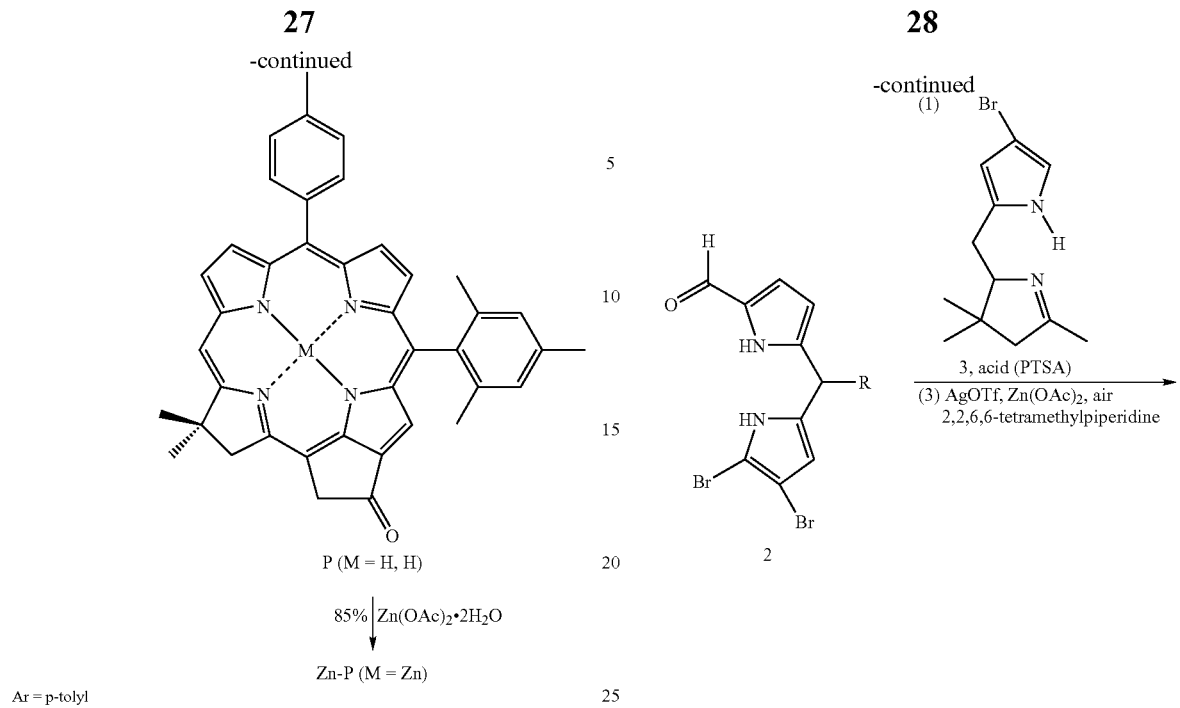

The synthesis of chlorins, bacteriochlorins, $13^1$-oxophorbines, and $13^1$-oxobacteriophorbines has been described in a number of our patent applications. Here we describe extension of these methods for the synthesis of $13^1$-oxophorbines and $13^1$-oxobacteriophorbines bearing the essential hydroxyalkyl moiety at the 3-position.

Syntheses of self-assembling $13^1$-oxophorbines and $13^1$-oxobacteriophorbines. The key design features of self-assembling $13^1$-oxophorbines and $13^1$-oxobacteriophorbines include (1) the presence of the 3-hydroxyalkyl [e.g., 3-(α-hydroxyethyl)] moiety, (2) the presence of the isocyclic ring, and (3) the presence of a metal such as zinc or magnesium. In addition, the ability to install electron-withdrawing/releasing substituents or auxochromes as specific sites would be exceptionally attractive for use of such materials in molecular solar cells.

The synthesis of a self-assembling $13^1$-oxophorbine is shown in Scheme 9. There are several novel features here: (1) use of the 1-formyl-8,9-dibromodipyrromethane 2, (2) use of the bromo-substituted Western half 3 (the synthesis is not shown here), (3) diacetylation of Zn-4 to give the 3,13-diacetylchlorin 5, and (4) regioselective 15-bromination of 5 to give 6. This synthesis constitutes the first synthesis of a stable, self-assembling chlorin. (Note that an oxophorbine is a type of chlorin.)

Scheme 9. Synthesis of a $13^1$-oxophorbine equipped for self-assembly.

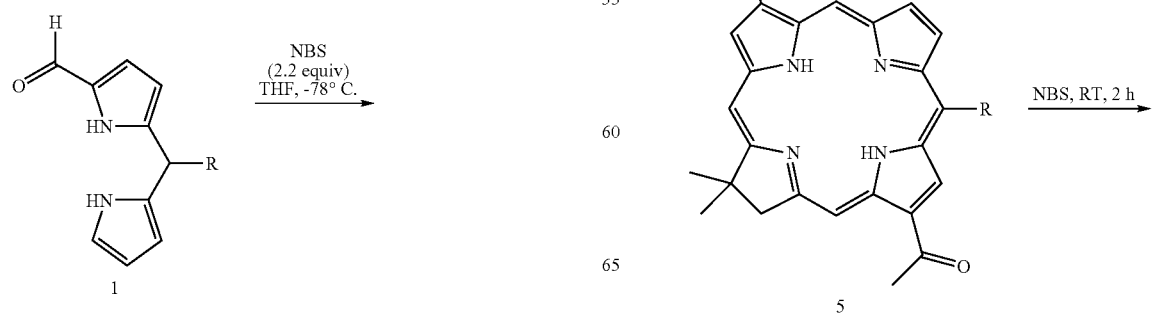

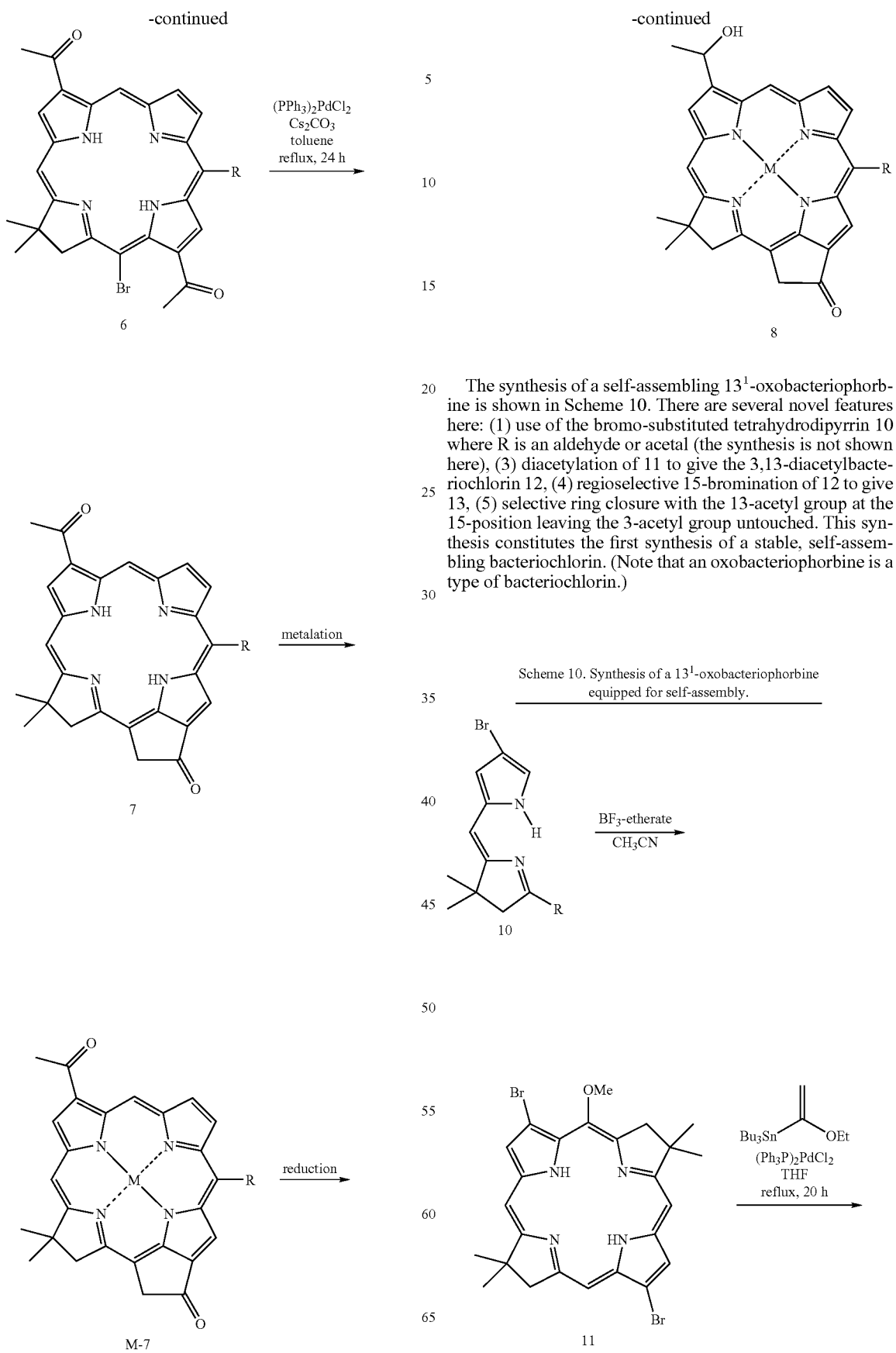

The synthesis of a self-assembling 13¹-oxobacteriophorbine is shown in Scheme 10. There are several novel features here: (1) use of the bromo-substituted tetrahydrodipyrrin 10 where R is an aldehyde or acetal (the synthesis is not shown here), (3) diacetylation of 11 to give the 3,13-diacetylbacteriochlorin 12, (4) regioselective 15-bromination of 12 to give 13, (5) selective ring closure with the 13-acetyl group at the 15-position leaving the 3-acetyl group untouched. This synthesis constitutes the first synthesis of a stable, self-assembling bacteriochlorin. (Note that an oxobacteriophorbine is a type of bacteriochlorin.)

Scheme 10. Synthesis of a 13¹-oxobacteriophorbine equipped for self-assembly.

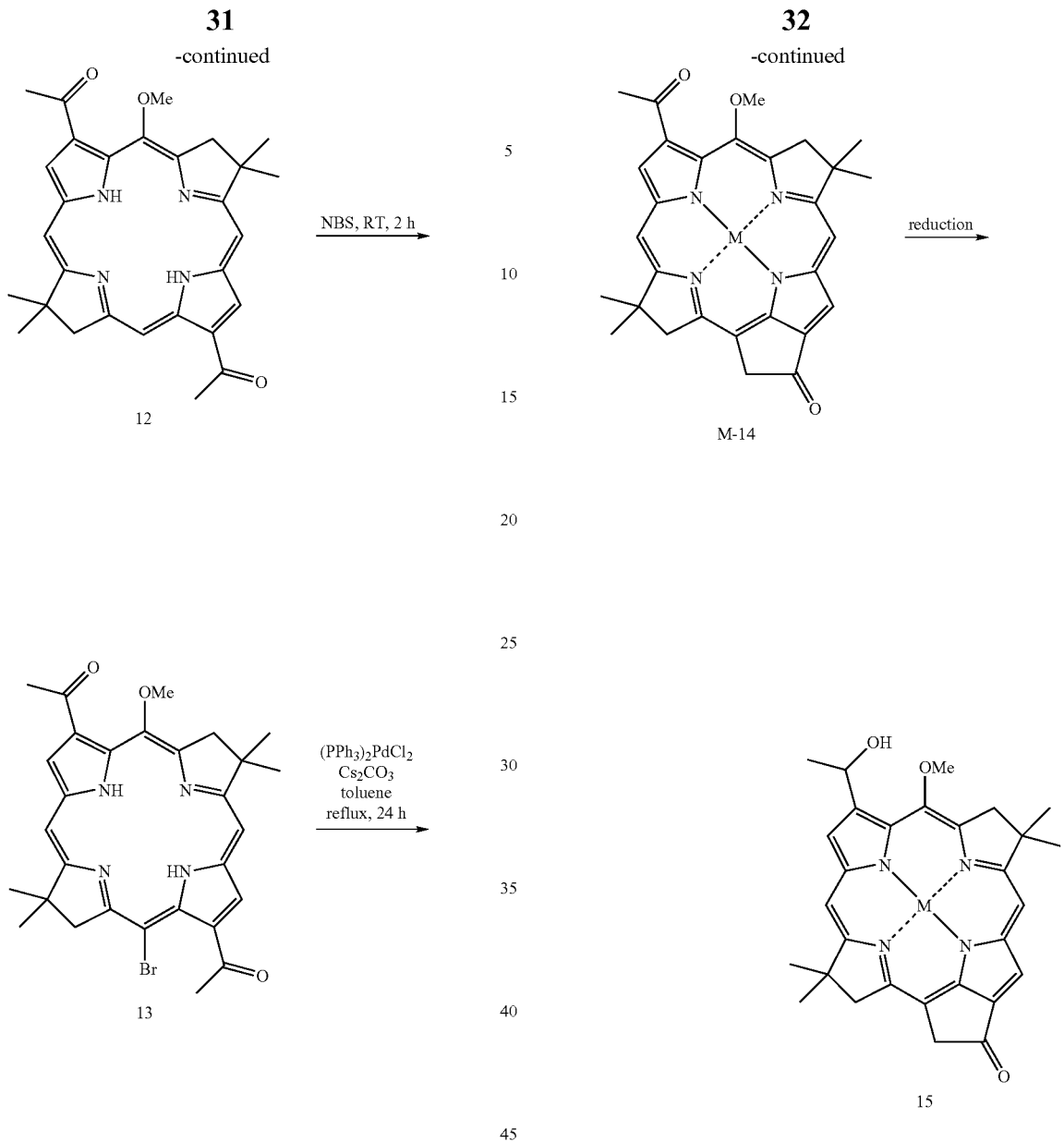

Example 2

Synthesis of Porphyrins Equipped for Self-Assembly into Light-Harvesting Architectures Nomenclature and Structures. The nomenclature of the naturally occurring self-assembling bacteriochlorophylls contains an unfortunate misnomer: such bacteriochlorins are actually dihydroporphyrins and formally are chlorins, not bacteriochlorins. The structures of three synthetic self-assembling porphyrinic pigments are shown in Scheme 11. The structure of "bacteriochlorophyll c" is provided for comparison, clearly showing that bacteriochlorophyll c is a chlorin.

The prior example described the synthesis of the $13^1$-oxo-bacteriophorbine and the $13^1$-oxophorbine. This examples focuses on the synthesis of the porphyrin analogue, namely the $13^1$-oxo-17,18-didehydrophorbine. The route exploits a known synthesis of trans-$A_2B_2$-porphyrins[58] and extends our prior route for installing the isocyclic ring.[55]

Scheme 11. Self-assembling porphyrinic pigments and comparison with bacteriochlorophyll c.
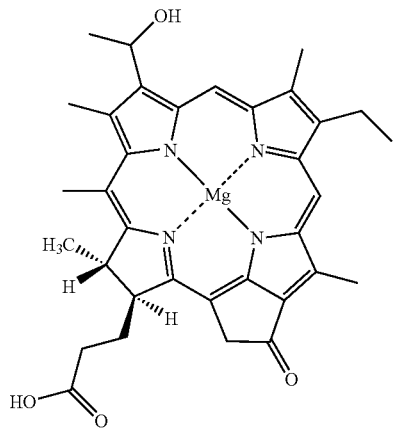
bacteriochlorophyll c
(a naturally occurring pigment
whose name is a misnomer)
| | Hydrogenation Level | Class name |
|---|---|---|
| 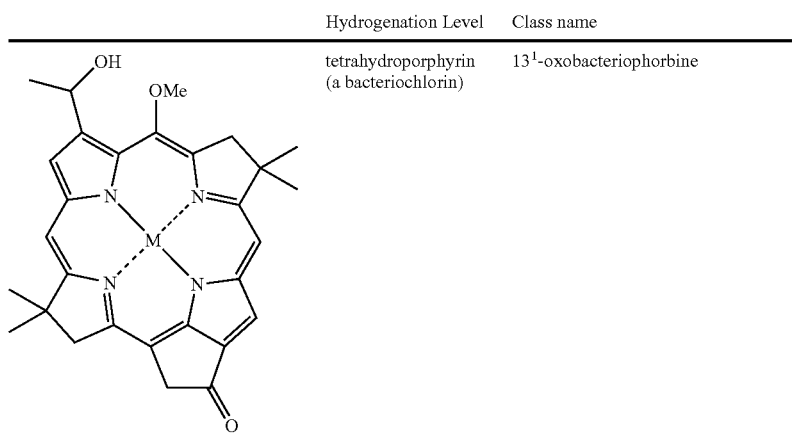 | tetrahydroporphyrin (a bacteriochlorin) | $13^1$-oxobacteriophorbine |
| 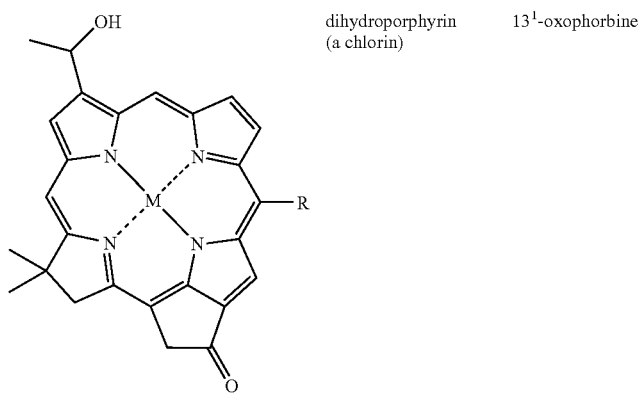 | dihydroporphyrin (a chlorin) | $13^1$-oxophorbine |

Scheme 11. Self-assembling porphyrinic pigments and comparison with bacteriochlorophyll c.

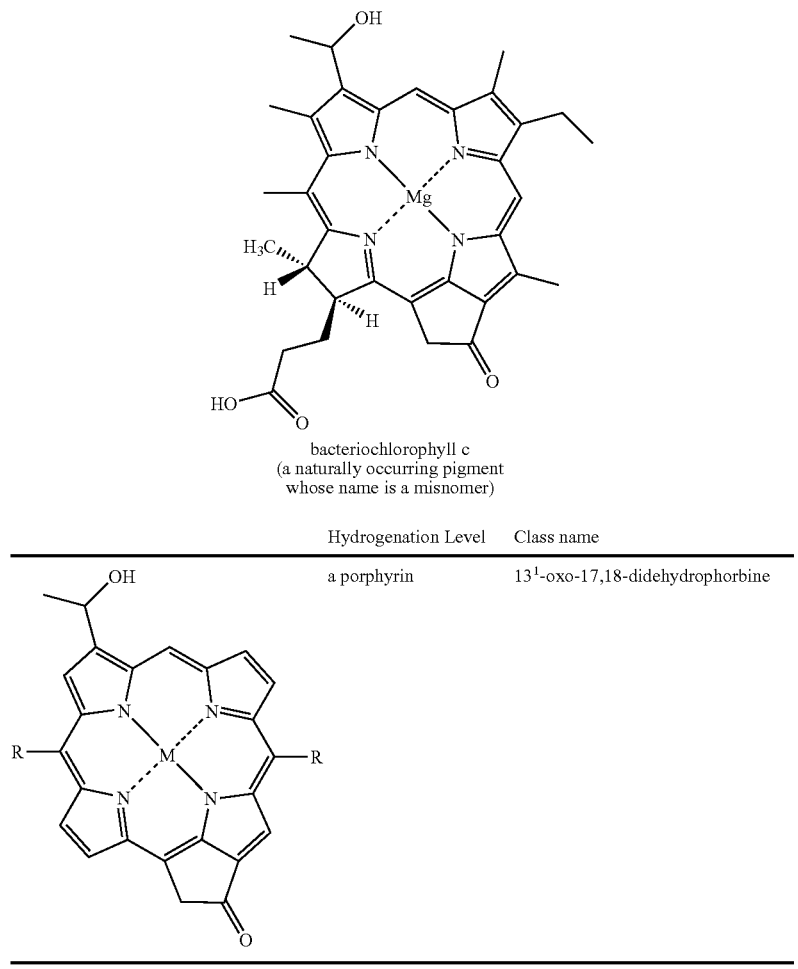

A photochemical point is relevant here. We note here that a chlorin or bacteriochlorin is a linear oscillator (regardless of metalation state) whereas metalloporphyrins are planar oscillators. In other words, the transition dipole moment pertaining to the photochemically relevant excited state in chlorins or bacteriochlorins is polarized along the axis of the molecule that bisects the N,N atoms and does not contain the pyrroline ring. In metalloporphyrins, the two transition dipole moments along the respective orthogonal N,N axes are equivalent. Hence a stronger directionality of energy transfer is expected with chlorins and bacteriochlorins versus metalloporphyrins. Free base porphyrins could be employed, but a central coordinating metal is believed to be essential for the self-assembly process. Regardless, the organization of the porphyrin macrocycles afforded by the self-assembly motif is anticipated to afford a viable light-harvesting architecture for use in solar cells.

Synthesis of self-assembling porphyrins. The key design features of self-assembling porphyrins include (1) the presence of the 3-hydroxyalkyl [e.g., 3-(α-hydroxyethyl)] moiety, (2) the presence of the isocyclic ring, and (3) the presence of a metal such as zinc or magnesium. In addition, the ability to install electron-withdrawing/releasing substituents or auxochromes at specific sites would be exceptionally attractive for use of such materials in molecular solar cells.

The synthesis of a self-assembling porphyrin is shown in Scheme 12. There are several novel features here: (1) use of a 1-formyl-3-bromodipyrromethane 3 in a self-condensation procedure to give a 3,13-dibromoporphyrin 4, (2) diacetylation of 4 to give the 3,13-diacetylchlorin 5, and (4) regioselective 15-bromination of 5 to give 6. This synthesis constitutes the first route to a porphyrin equipped for self-assembly analogous to that of bacteriochlorophyll c. Metalation can be done in the standard way to obtain the zinc or magnesium chelate. Reduction is achieved with an achiral reagent to give a mixture of enantiomers, or a chiral reagent in an asymmetric reduction to favor the R or S enantiomer.

Scheme 12. Synthesis of a porphyrin equipped for self-assembly.

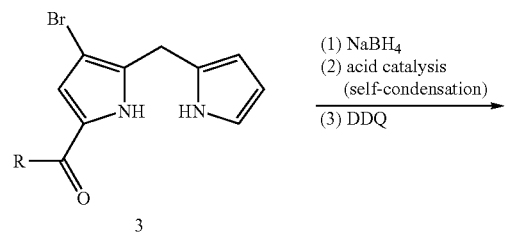

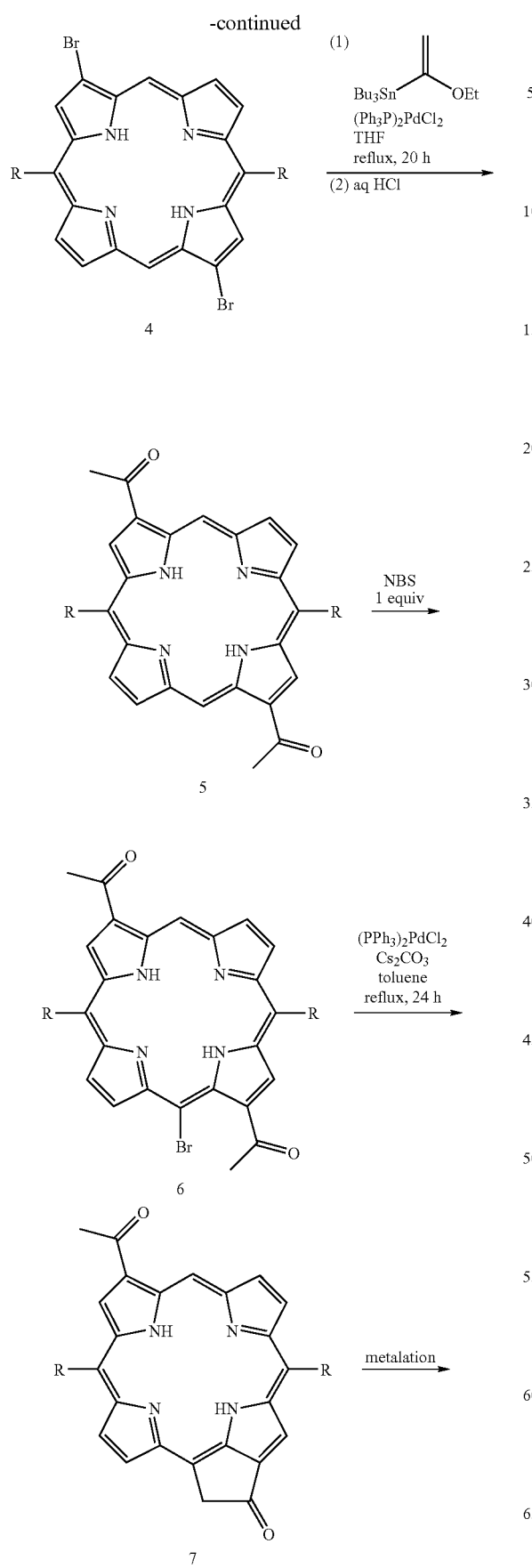
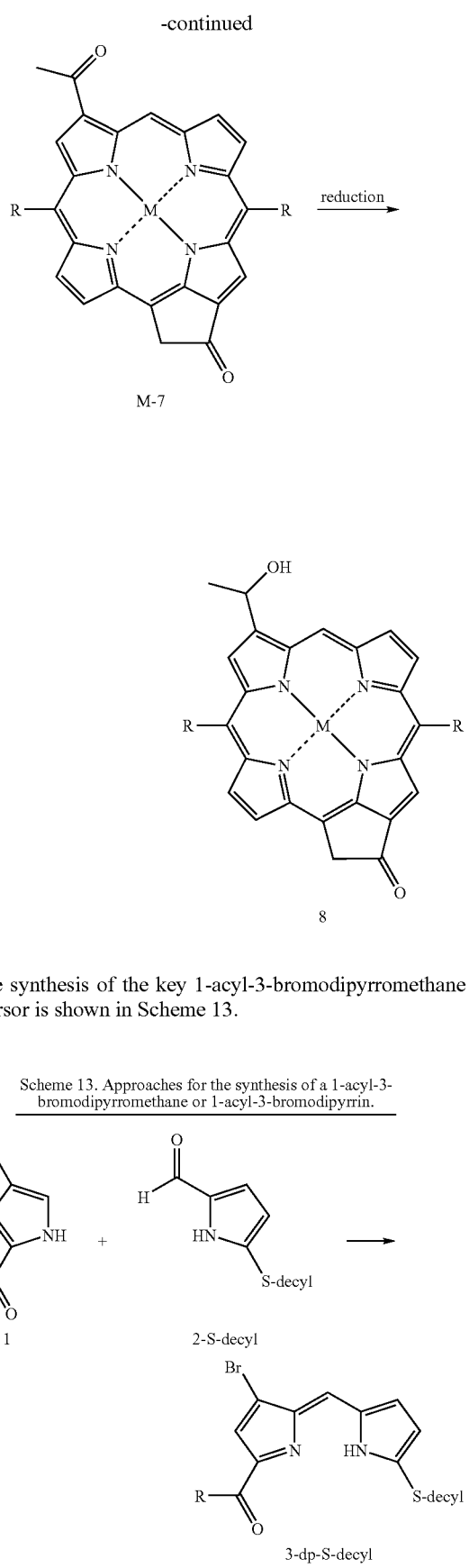
The synthesis of the key 1-acyl-3-bromodipyrromethane precursor is shown in Scheme 13.
Scheme 13. Approaches for the synthesis of a 1-acyl-3-bromodipyrromethane or 1-acyl-3-bromodipyrrin.
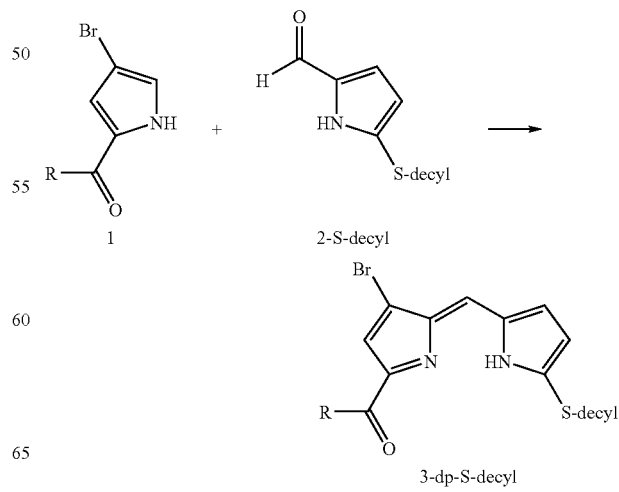

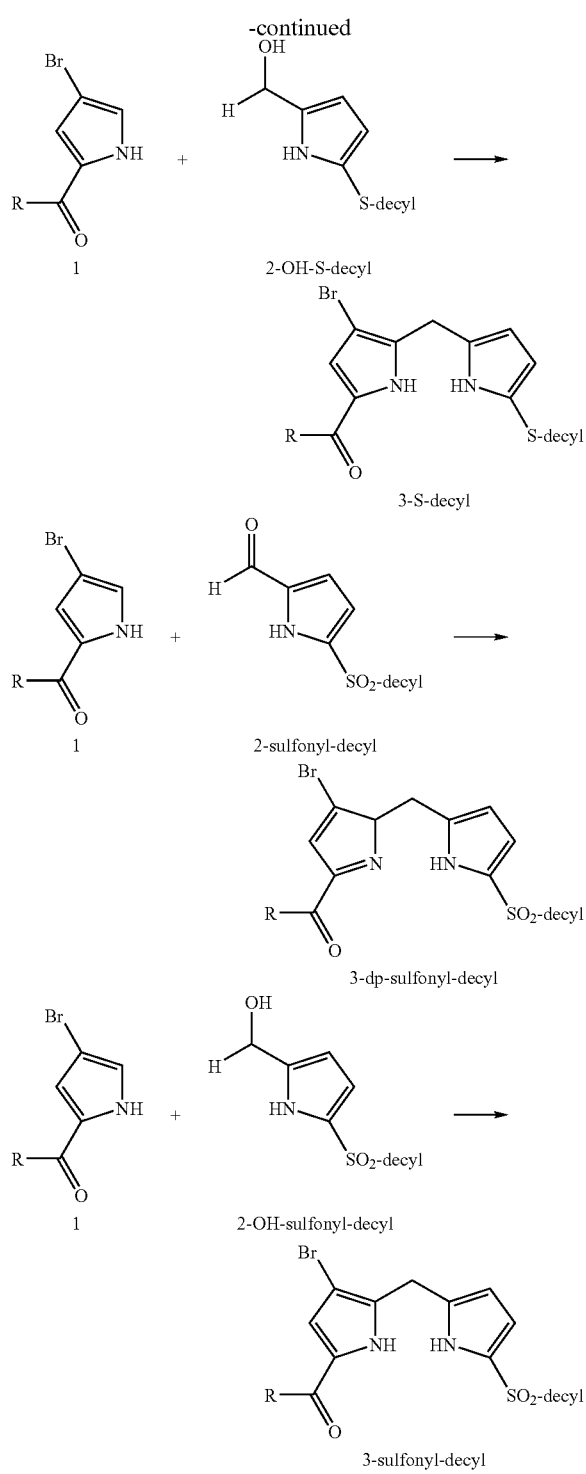

A 2-acyl-4 bromopyrrole (1) is prepared in a straightforward manner by (i) 2-acylation using one of a variety of standard methods, including use of Mukaiyama reagents, and (ii) subsequent bromination, which proceeds regioselectively at the 4-position. The counterpart of 1 is a 2,5-disubstituted pyrrole (2-x), where one pyrrolic α-position is masked with an alkylthio or alkylsulfonyl group, and the other α-position bears the reacting formyl of hydroxymethyl species. The 2-alkylthio moiety is a potent α-pyrrolic protecting group that does not deactivate the ring.[59] Formylation at the 5-position can be achieved using the Vilsmeier reagent, or using a procedure we described recently, which entails a Grignard reagent and phenyl formate.[60] The condensation of 1 and 2-x can be carried out under acidic conditions to give the dipyrrin (dp) or dipyrromethane. A notable attraction of this route is that neither 1 nor 2-x can undergo self-condensation. The alkylthio or alkylsulfonyl moiety can be removed in a straightforward manner. The dipyrrin can be converted to the dipyrromethane (by reduction using NaBH$_4$) for use in the porphyrin-forming procedure.

Finally, we emphasize again the utility of this de novo synthesis of a self-assembling porphyrin. The ability to constrict the macrocycle from simple precursors provides a great deal of flexibility in the design of molecules suitable for use in solar cells. The nature of the R group at the 10- or 20-position can be varied to impart steric bulk (methyl, phenyl, 3,5-di-tert-butylphenyl, etc.) or alter the electrochemical potential (pentafluorophenyl versus p-methoxyphenyl). Such features are not readily accessible by derivatization of naturally occurring porphyrinic pigments.

REFERENCES

(25) Smith, K. M.; Kehres, L. A.; Fajer, J. *J. Am. Chem. Soc.* 1983, 105, 1387-1389.

(26) Chiefari, J.; Griebenow, K.; Griebenow, N.; Balaban, T. S.; Holzwarth, A. R.; Schaffner, K. *J. Phys. Chem.* 1995, 99, 1357-1365.

(27) Balaban, T. S.; Linke-Schaetzel, M.; Bhise, A. D.; Vanthuyne, N.; Roussel, C. *Eur. J. Org. Chem.* 2004, 18, 3919-3930.

(28) Balaban, T. S.; Eichhofer, A.; Lehn, J.-M. *Eur. J. Org. Chem.* 2000, 4047-4057.

(29) Tamiaki, H.; Takeuchi, S.; Tanikaga, R.; Balaban, S. T.; Holzwarth, A. R.; Schaffner, K. *Chem. Lett.* 1994, 401-402.

(30) Tamiaki, H.; Holzwarth, A. R.; Schaffner, K. *Photosynth. Res.* 1994, 41, 245-251.

(31) Tamiaki, H.; Miyata, S.; Kureishi, Y.; Tanikaga, R. *Tetrahedron* 1996, 52, 12421-12432.

(32) Tamiaki, H.; Kubota, T.; Tanikaga, R. *Chem. Lett.* 1996, 8, 639-640.

(33) Tamiaki, H.; Amakawa, M.; Shimono, Y.; Tanikaga, R.; Holzwarth, A. R.; Schaffner, K. *Photochem. Photobiol.* 1996, 63, 92-99.

(34) Yagai, S.; Miyatake, T.; Shimono, Y.; Tamiaki, H. *Photochem. Photobiol.* 2001, 73, 153-163.

(35) Tamiaki, H.; Kouraba, M. *Tetrahedron* 1997, 53, 10677-10688.

(36) (a) Oba, T.; Furukawa, H.; Wang, Z.-Y.; Nozawa, T.; Mimuro, M.; Tamiaki, H.; Watanabe, T. *J. Phys. Chem. B* 1998, 102, 7882-7889. (b) Furnkawa, H.; Oba, T.; Tamiaki, H.; Watanabe, T. *J. Phys. Chem. B* 1999, 103, 7398-7405.

(37) Tamiaki, H.; Miyatake, T.; Tanikaga, R. *Tetrahedron Lett.* 1997, 38, 267-270.

(38) Yagai, S.; Miyatake, T.; Tamiaki, H. *J. Org. Chem.* 2002, 67, 49-58.

(39) Oba, T.; Tamiaki, H. *Photochem. Photobiol.* 1998, 67, 295-303.

(40) Yagai, S.; Miyatake, T.; Tamiaki, H. *J. Photochem. Photobiol. B: Biol.* 1999, 52, 74-85.

(41) Miyatake, T.; Tamiaki, H.; Holzwarth, A. R.; Schaffner, K. in *Photosynthesis: Mechanisms and Effects, Proceedings of the International Congress on Photosynthesis,*

(41) 11th, Budapest, Aug. 17-22, 1998; Garab, G.; Ed.; Kluwer Academic Publishers: Netherlands, 1998; Vol. 1, pp 133-136.

(42) Oba, T.; Tamiaki, H. in *Photosynthesis: Mechanisms and Effects, Proceedings of the International Congress on Photosynthesis*, 11th, Budapest, Aug. 17-22, 1998; Garab, G.; Ed.; Kluwer Academic Publishers: Netherlands, 1998; Vol. 1, pp 465-468.

(43) Oba, T.; Tamiaki, H. *Photosynth. Res.* 1999, 61, 23-31.

(44) Yagai, S.; Tamiaki, H. *J. Chem. Soc. Perkin Trans.* 1 2001, 3135-3144.

(45) Tamiaki, H.; Amakawa, M.; Holzwarth, A. R.; Schaffner, K. *Photosynth. Res.* 2002, 71, 59-67.

(46) Sasaki, S.-i.; Omoda, M.; Tamiaki, H. *J. Photochem. Photobiol. A: Chem.* 2004, 162, 307-315.

(47) Sasaki, S.-i.; Tamiaki, H. *Bull Chem. Soc. Jpn.* 2004, 77, 797-800.

(52) Strachan, J.-P.; O'Shea, D. F.; Balasubramanian, T.; Lindsey, J. S. *J. Org. Chem.* 2000, 65, 3160-3172.

(53) Taniguchi, M.; $R_a$, D.; Mo, G.; Balasubramanian, T.; Lindsey, J. S. *J. Org. Chem.* 2001, 66, 7342-7354.

(54) Balasubramanian, T.; Strachan, J. P.; Boyle, P. D.; Lindsey, J. S. *J. Org. Chem.* 2000, 65, 7919-7929.

(55) Laha, J. K.; Muthiah, C.; Taniguchi, M.; Lindsey, J. S. *J. Org. Chem.* 2006, 71, web ASAP.

(56) Taniguchi, M.; Kim, M. N.; Ra, D.; Lindsey, J. S. *J. Org. Chem.* 2005, 70, 275-285.

(57) Kim, H.-J.; Lindsey, J. S. *J. Org. Chem.* 2005, 70, 5475-5486.

(58) Rao, P. D.; Littler, B. J.; Geier, G. R., III; Lindsey, J. S. *J. Org. Chem.* 2000, 65, 1084-1092.

(59) Thamyongkit, P.; Bhise, A. D.; Taniguchi, M.; Lindsey, J. S. *J. Org. Chem.* 2006, 71, 903-910.

(60) Ptaszek, M.; McDowell, B. E.; Lindsey, J. S. *J. Org. Chem.* 2006, 71, 4328-4331.

The foregoing is illustrative of the present invention, and is not to be construed as limiting thereof. The invention is defined by the following claims, with equivalents of the claims to be included therein.

The invention claimed is:

1. A solar cell, comprising:
   (a) a semiconductor charge separation material;
   (b) at least one electrode connected to said charge separation material; and
   (c) a light-harvesting film on said charge separation material, said light-harvesting film comprising non-covalently coupled, self-assembled units of porphyrinic macrocycles;
   wherein said porphyrinic macrocycles comprise: (i) an intramolecularly coordinated metal; (ii) a first coordinating substituent; and (iii) a second coordinating substituent opposite said first coordinating substituent;
   and wherein said porphyrinic macrocycles are assembled by repeating intermolecular coordination complexes of said metal, said first coordinating substituent and said second coordinating substituent.

2. The solar cell of claim 1, wherein said first coordinating substituent is selected from the group consisting of hydroxy, mercapto, and amino.

3. The solar cell of claim 1, wherein said second coordinating substituent is selected from the group consisting of oxo and thio.

4. The solar cell of claim 1, wherein said metal is selected from the group consisting of zinc and magnesium.

5. The solar cell of claim 1, wherein said porphyrinic macrocycles are selected from the group consisting of didehydrophorbines, phorbines, and bacteriophorbines.

6. The solar cell of claim 1, said light-harvesting film having a maximum peak absorption between 200 to 1200 nanometers.

7. The solar cell of claim 1, wherein said semiconductor charge separation material comprises a p region and an n region, wherein at least one electrode is connected to said p region, and wherein at least one electrode is connected to said n region.

8. The solar cell of claim 1, wherein said porphyrinic macrocycles comprise compounds of Formula I:

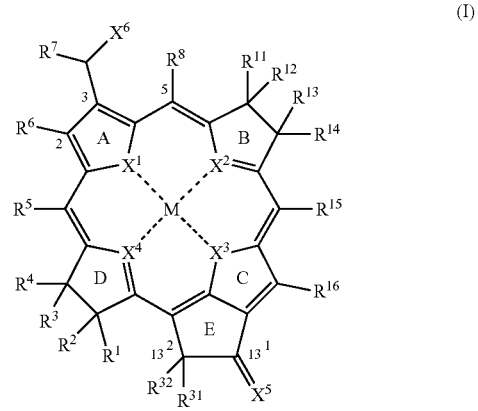

(I)

wherein:

M is a metal;

$X^1$, $X^2$, $X^3$ and Xi are each independently selected from the group consisting of Se, NH, $CH_2$, O and S;

$X^5$ is O or S;

$X^6$ is OH, SH, or $NR^{41}R^{42}$;

$R^1$, $R^2$, $R^3$, $R^4$, $R^5$, $R^6$, $R^7$, $R^8$, $R^{11}$, $R^{12}$, $R^{13}$, $R^{14}$, $R^{15}$, $R^{16}$, $R^{31}$, $R^{32}$, $R^{41}$ and $R^{42}$ are each independently selected from the group consisting of H, alkyl, alkenyl, alkynyl, cycloalkyl, cycloalkylalkyl, cycloalkylalkenyl, cycloalkylalkynyl, heterocyclo, heterocycloalkyl, heterocycloalkenyl, heterocycloalkynyl, aryl, aryloxy, arylalkyl, arylalkenyl, arylalkynyl, heteroaryl, heteroarylalkyl, heteroarylalkenyl, heteroarylalkynyl, alkoxy, halo, mercapto, azido, cyano, acyl, formyl, carboxylic acid, acylamino, ester, amide, hydroxyl, nitro, alkylthio, amino, alkylamino, arylalkylamino, disubstituted amino, acyloxy, sulfoxyl, sulfonyl, sulfonate, sulfonic acid, sulfonamide, urea, alkoxylacylamino, aminoacyloxy, surface attachment groups, and auxochromes, wherein each pair of $R^1$ and $R^2$, $R^3$ and $R^4$, $R^{11}$ and $R^{12}$, $R^{13}$ and $R^{14}$, or $R^{31}$ and $R^{32}$, can together form =O;

wherein each of $R^1$ and $R^2$, $R^3$ and $R^4$, $R^{11}$ and $R^{12}$, or $R^{13}$ and $R^{14}$, can together form spiroalkyl;

wherein $R^2$ and $R^3$ can together form a double bond; and wherein $R^{12}$ and $R^{13}$ can together form a double bond; or a salt thereof.

9. The solar cell of claim 1, wherein said porphyrinic macrocycles comprise compounds selected from the group consisting of (a) 17,18-didehydrophorbines of Formula Ia:

(I)

[Chemical structure of Formula I]

(b) phorbines of Formula Ib and Ib':

(Ib)

[Chemical structure of Formula Ib]

(Ib')

[Chemical structure of Formula Ib']

and:

(c) bacteriophorbines of Formula Ic:

(Ic)

[Chemical structure of Formula Ic]

wherein:
M is a metal;
$X^1, X^2, X^3$ and $X^4$ are each independently selected from the group consisting of Se, NH, $CH_2$, O and S;
$X^5$ is O or S;
$X^6$ is OH, SH, or $NR^{41}R^{42}$;
$R^1, R^2, R^3, R^4, R^5, R^6, R^7, R^8, R^{11}, R^{12}, R^{13}, R^{14}, R^{15}, R^{16}, R^{31}, R^{32}, R^{41}$ and $R^{42}$ are each independently selected from the group consisting of H, alkyl, alkenyl, alkynyl, cycloalkyl, cycloalkylalkyl, cycloalkylalkenyl, cycloalkylalkynyl, heterocyclo, heterocycloalkyl, heterocycloalkenyl, heterocycloalkynyl, aryl, aryloxy, arylalkyl, arylalkenyl, arylalkynyl, heteroaryl, heteroarylalkyl, heteroarylalkenyl, heteroarylalkynyl, alkoxy, halo, mercapto, azido, cyano, acyl, formyl, carboxylic acid, acylamino, ester, amide, hydroxyl, nitro, alkylthio, amino, alkylamino, arylalkylamino, disubstituted amino, acyloxy, sulfoxyl, sulfonyl, sulfonate, sulfonic acid, sulfonamide, urea, alkoxylacylamino, aminoacyloxy, surface attachment groups, and auxochromes,
wherein each pair of $R^1$ and $R^2$, $R^3$ and $R^4$, $R^{11}$ and $R^{12}$, $R^{13}$ and $R^{14}$, or $R^{31}$ and $R^{32}$, can together form =O;
wherein each of $R^1$ and $R^2$, $R^3$ and $R^4$, $R^{11}$ and $R^{12}$, or $R^{13}$ and $R^{14}$, can together form spiroalkyl;
wherein $R^2$ and $R^3$ can together form a double bond; and
wherein $R^{12}$ and $R^{13}$ can
together form a double bond;
or a salt thereof.

10. The solar cell of claim 1, wherein said light-harvesting film comprises at least one layer selected from the group consisting of a didehydrophorbine layer, a phorbine layer, and a bacteriophorbine layer;
with said layers arranged with one another and said charge separation material in the order of: said didehydrophorbine layer when present, said phorbine layer when present, said bacteriophorbine layer when present, and then said charge separation material.

11. The solar cell of claim 10, wherein said light-harvesting film comprises a didehydrophorbine layer and a phorbine layer, a didehydrophorbine layer and a bacteriophorbine layer, or a phorbine layer and a bacteriophorbine layer.

12. The solar cell of claim 10, wherein said light-harvesting film comprises a didehydrophorbine layer, a phorbine layer, and a bacteriophorbine layer.

13. A method of making a solar cell of claim 1, comprising
(a) providing a semiconductor charge separation material;
(b) coating said semiconductor charge separation material with said porphyrinic macrocycle under conditions in which said porphyrinic macrocycle self-assembles to form said light-harvesting film thereon; and (c) connecting said at least one electrode to said semiconductor p region before or after said coating step.

14. The method of claim 13, wherein said coating step is carried out by physical vapor deposition, chemical vapor deposition, spin coating, dip coating, spraying, ink-jet printing, or casting.

15. A compound of Formula I:

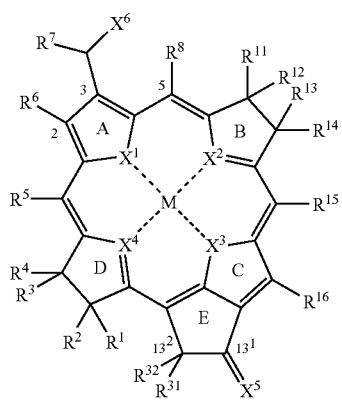

(I)

wherein:

M is a metal;

$X^1$, $X^2$, $X^3$ and $X^4$ are each independently selected from the group consisting of Se, NH, $CH_2$, O and S;

$X^5$ is O or S;

$X^6$ is OH, SH, or $NR^{41}R^{42}$;

$R^1$ and $R^2$ are each independently selected from the group consisting of H, alkyl, alkenyl, and alkynyl, or together form =O;

$R^3$, $R^4$, $R^5$, $R^6$, $R^7$, $R^8$, $R^{11}$, $R^{12}$, $R^{13}$, $R^{14}$, $R^{15}$, $R^{16}$, $R^{31}$, $R^{32}$, $R^{41}$ and $R^{42}$ are each independently selected from the group consisting of H, alkyl, alkenyl, alkynyl, cycloalkyl, cycloalkylalkyl, cycloalkylalkenyl, cycloalkylalkynyl, heterocyclo, heterocycloalkyl, heterocycloalkenyl, heterocycloalkynyl, aryl, aryloxy, arylalkyl, arylalkenyl, arylalkynyl, heteroaryl, heteroarylalkyl, heteroarylalkenyl, heteroarylalkynyl, alkoxy, halo, mercapto, azido, cyano, acyl, formyl, carboxylic acid, acylamino, ester, amide, hydroxyl, nitro, alkylthio, amino, alkylamino, arylalkylamino, disubstituted amino, acyloxy, sulfoxyl, sulfonyl, sulfonate, sulfonic acid, sulfonamide, urea, alkoxylacylamino, aminoacyloxy, surface attachment groups, and auxochromes, wherein each pair of $R^3$, and $R^4$, $R^{11}$ and $R^{12}$, $R^{13}$ and $R^{14}$, or $R^{31}$ and $R^{32}$, can together form =O;

wherein each of $R^3$ and $R^4$, $R^{11}$ and $R^{12}$, or $R^{13}$ and $R^{14}$, can together form spiroalkyl;

wherein $R^2$ and $R^3$ can together form a double bond; and wherein $R^{12}$ and $R^{13}$ can together form a double bond; or a salt thereof.

16. The compound of claim 15 selected from the group consisting of:

(a) 17,18-didehydrophorbines of Formula Ia:

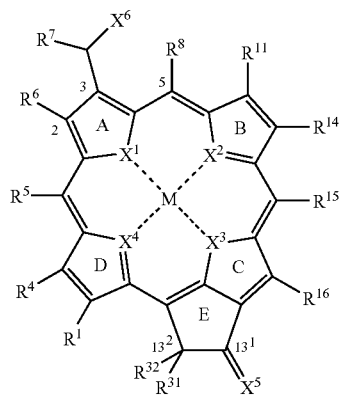

(b) phorbines of Formula Ib and Ib':

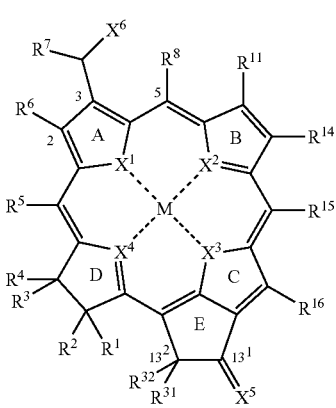

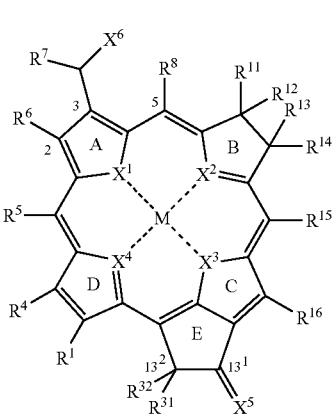

and:

(c) bacteriophorbines of Formula Ic:

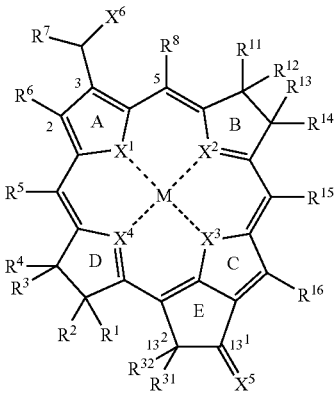

(Ic)

wherein:

M is a metal;

$X^1, X^2, X^3$ and $X^4$ are each independently selected from the group consisting of Se, NH, $CH_2$, O and S;

$X^5$ is O or S;

$X^6$ is OH, SH, or $NR^{41}R^{42}$;

$R^3, R^4, R^5, R^6, R^7, R^8, R^{11}, R^{12}, R^{13}, R^{14}, R^{15}, R^{16}, R^{31}, R^{32}, R^{41}$ and $R^{42}$ are each independently selected from the group consisting of H, alkyl, alkenyl, alkynyl, cycloalkyl, cycloalkylalkyl, cycloalkylalkenyl, cycloalkylalkynyl, heterocyclo, heterocycloalkyl, heterocycloalkenyl, heterocycloalkynyl, aryl, aryloxy, arylalkyl, arylalkenyl, arylalkynyl, heteroaryl, heteroarylalkyl, heteroarylalkenyl, heteroarylalkynyl, alkoxy, halo, mercapto, azido, cyano, acyl, formyl, carboxylic acid, acylamino, ester, amide, hydroxyl, nitro, alkylthio, amino, alkylamino, arylalkylamino, disubstituted amino, acyloxy, sulfoxyl, sulfonyl, sulfonate, sulfonic acid, sulfonamide, urea, alkoxylacylamino, aminoacyloxy, surface attachment groups, and auxochromes, wherein each pair of $R^3$ and $R^4$, $R^{11}$ and $R^{12}$, $R^{13}$ and $R^{14}$, or $R^{31}$ and $R^{32}$, can together form =O;

wherein each of $R^3$ and $R^4$, $R^{11}$ and $R^{12}$, or $R^{13}$ and $R^{14}$, can together form spiroalkyl;

wherein $R^2$ and $R^3$ can together form a double bond; and wherein $R^{12}$ and $R^{13}$ can together form a double bond; or a salt thereof.

17. The compound of claim 15, wherein $R^1$ and $R^2$ are each independently selected from the group consisting of H, alkyl, and alkynyl, or together form =O.

18. The compound of claim 15, wherein $R^1$ and $R^2$ are both H.

19. The solar cell of claim 8, wherein $R^1$ and $R^2$ are each independently selected from the group consisting of H, alkyl, alkenyl and alkynyl, or together form =O.

20. The method of claim 13, wherein said porphyrinic macrocycles comprise compounds of Formula I:

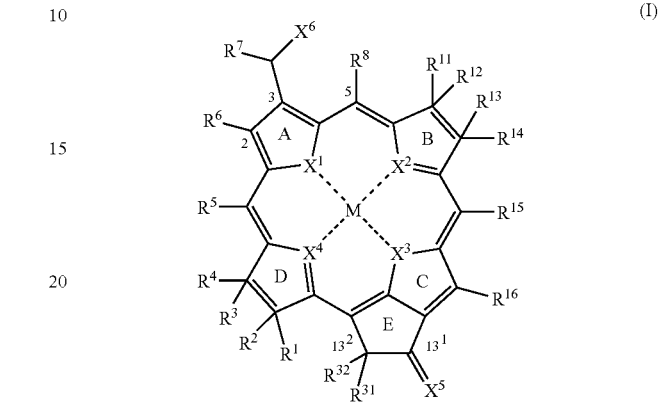

(I)

wherein:

M is a metal;

$X^1, X^2, X^3$ and $X^4$ are each independently selected from the group consisting of Se, NH, $CH_2$, O and S;

$X^5$ is O or S;

$X^6$ is OH, SH, or $NR^{41}R^{42}$;

$R^1, R^2, R^3, R^4, R^5, R^6, R^7, R^8, R^{11}, R^{12}, R^{13}, R^{14}, R^{15}, R^{16}, R^{31}, R^{32}, R^{41}$ and $R^{42}$ are each independently selected from the group consisting of H, alkyl, alkenyl, alkynyl, cycloalkyl, cycloalkylalkyl, cycloalkylalkenyl, cycloalkylalkynyl, heterocyclo, heterocycloalkyl, heterocycloalkenyl, heterocycloalkynyl, aryl, aryloxy, arylalkyl, arylalkenyl, arylalkynyl, heteroaryl, heteroarylalkyl, heteroarylalkenyl, heteroarylalkynyl, alkoxy, halo, mercapto, azido, cyano, acyl, formyl, carboxylic acid, acylamino, ester, amide, hydroxyl, nitro, alkylthio, amino, alkylamino, arylalkylamino, disubstituted amino, acyloxy, sulfoxyl, sulfonyl, sulfonate, sulfonic acid, sulfonamide, urea, alkoxylacylamino, aminoacyloxy, surface attachment groups, and auxochromes, wherein each pair of $R^1$ and $R^2$, $R^3$ and $R^4$, $R^{11}$ and $R^{12}$, $R^{13}$ and $R^{14}$, or $R^{31}$ and $R^{32}$, can together form =O;

wherein each of $R^1$ and $R^2$, $R^3$ and $R^4$, $R^{11}$ and $R^{12}$, or $R^{13}$ and $R^{14}$, can together form spiroalkyl;

wherein $R^2$ and $R^3$ can together form a double bond; and wherein $R^{12}$ and $R^{13}$ can together form a double bond; or a salt thereof.

21. The method of claim 20, wherein $R^1$ and $R^2$ are each independently selected from the group consisting of H, alkyl, alkenyl, and alkynyl, or together form =O.

* * * * *

UNITED STATES PATENT AND TRADEMARK OFFICE
CERTIFICATE OF CORRECTION

PATENT NO. : 7,633,007 B2
APPLICATION NO. : 11/782288
DATED : December 15, 2009
INVENTOR(S) : Lindsey et al.

It is certified that error appears in the above-identified patent and that said Letters Patent is hereby corrected as shown below:

In the Specifications:
Column 13, Lines 40 - 41: Please correct the third molecule described
"-CH-)CH$_2$CH$_2$CH$_2$Ch$_2$-" to read -- -CH$_2$CH$_2$CH$_2$CH$_2$CH$_2$- --.

Column 19, Scheme 6, molecule Ac$^{13}$X$^{15}$-chlorin: Directional arrow and
"Halogenation" should be above the molecule, not inside the structure:

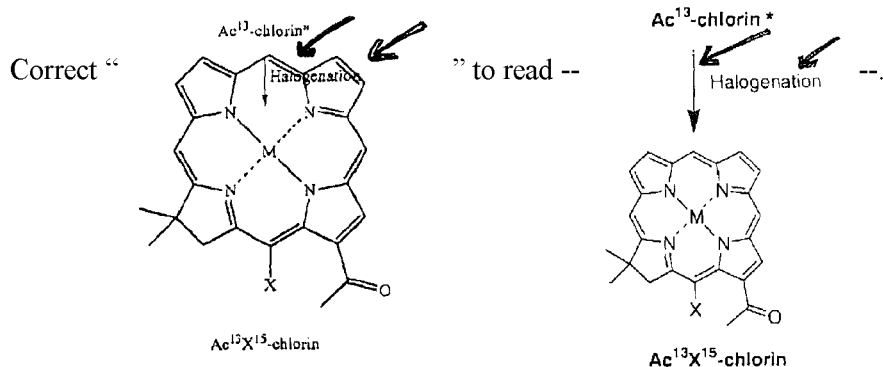

Column 26, continuation of Scheme 8, Line 24: Please add the phrase
-- Ar = $p$-tolyl -- after "M(M=H,H".

Column 39, Line 32, molecule 3-dp-sulfonyl-decyl: Please add a double line to
molecule as shown below:

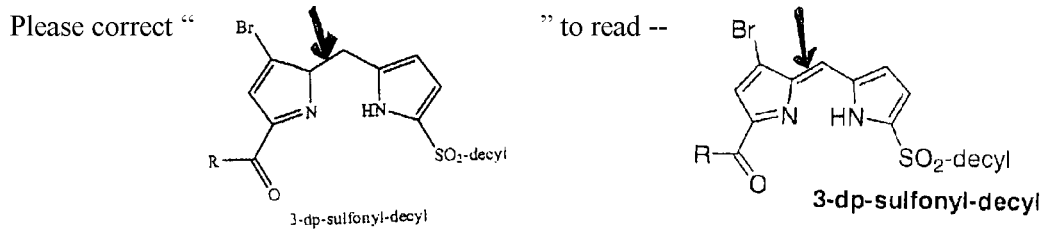

CERTIFICATE OF CORRECTION (continued)

U.S. Pat. No. 7,633,007 B2

In the Claims:

Column 42, Claim 8, Line 39: Please correct "and Xi" to read -- and $X^4$--.

Column 48, Claim 20, Formula 1, Line 20: Please delete double line found in molecule between $R^4$ and $R^1$ as well as $R^{12}$ and $R^{13}$ as shown below:

Please correct " 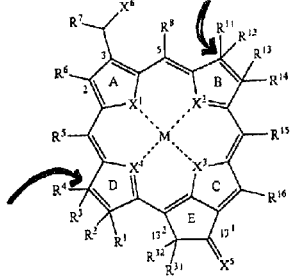 " to read -- 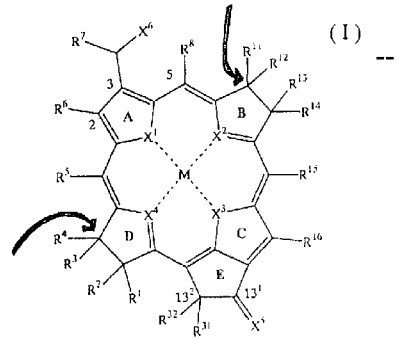 --.

Signed and Sealed this

Sixteenth Day of March, 2010

David J. Kappos
*Director of the United States Patent and Trademark Office*